United States Patent
Kim et al.

(10) Patent No.: US 9,065,014 B2
(45) Date of Patent: Jun. 23, 2015

(54) THERMOELECTRIC MATERIAL INCLUDING COATING LAYERS, METHOD OF PREPARING THE THERMOELECTRIC MATERIAL, AND THERMOELECTRIC DEVICE INCLUDING THE THERMOELECTRIC MATERIAL

(75) Inventors: Sang-il Kim, Seoul (KR); Kyu-hyoung Lee, Yongin-si (KR); Sang-mock Lee, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 136 days.

(21) Appl. No.: 13/327,940

(22) Filed: Dec. 16, 2011

(65) Prior Publication Data

US 2012/0152294 A1    Jun. 21, 2012

(30) Foreign Application Priority Data

Dec. 17, 2010    (KR) ........................ 10-2010-0129991

(51) Int. Cl.
| | | |
|---|---|---|
| H01L 35/00 | (2006.01) | |
| H01L 35/32 | (2006.01) | |
| H01L 35/18 | (2006.01) | |
| H01L 35/16 | (2006.01) | |
| C23C 14/06 | (2006.01) | |
| C23C 14/16 | (2006.01) | |

(52) U.S. Cl.
CPC ................. *H01L 35/32* (2013.01); *H01L 35/18* (2013.01); *H01L 35/16* (2013.01); *C23C 14/06* (2013.01); *C23C 14/16* (2013.01)

(58) Field of Classification Search
CPC ..................... H01L 35/32; H01L 35/16–35/18
USPC .......................................................... 136/200
See application file for complete search history.

(56) References Cited

U.S. PATENT DOCUMENTS

| | | | |
|---|---|---|---|
| 5,507,879 A * | 4/1996 | Gyoten et al. ................ 136/224 |
| 2002/0026856 A1* | 3/2002 | Suzuki et al. ................... 75/343 |
| 2006/0102224 A1* | 5/2006 | Chen et al. .................... 136/203 |
| 2008/0202575 A1* | 8/2008 | Ren et al. ...................... 136/201 |
| 2010/0059723 A1 | 3/2010 | Lee et al. |
| 2010/0108115 A1 | 5/2010 | Lee et al. |
| 2010/0236596 A1 | 9/2010 | Lee et al. |
| 2011/0036385 A1 | 2/2011 | Lee et al. |
| 2011/0100409 A1 | 5/2011 | Kim et al. |
| 2011/0139208 A1 | 6/2011 | Lee et al. |
| 2011/0247671 A1 | 10/2011 | Kim et al. |
| 2012/0128867 A1* | 5/2012 | Paulson ........................ 427/78 |

OTHER PUBLICATIONS

Leszczynski et al. "Comparison of thermal oxidation behaviour of CoSb3 and CoP3", Proceedings of the 5th European conference on thermoelectrics, Sep. 10-12, 2007.*

* cited by examiner

*Primary Examiner* — Allison Bourke
(74) *Attorney, Agent, or Firm* — Cantor Colburn LLP

(57) ABSTRACT

A thermoelectric material includes powders having a surface coated with an inorganic material. The thermoelectric material includes a thermoelectric semiconductor powder and a coating layer on an outer surface of the thermoelectric semiconductor powders.

6 Claims, 30 Drawing Sheets

THERMOELECTRIC MATERIAL INCLUDING COATING LAYERS, METHOD OF PREPARING THE THERMOELECTRIC MATERIAL, AND THERMOELECTRIC DEVICE INCLUDING THE THERMOELECTRIC MATERIAL

CROSS-REFERENCE TO RELATED APPLICATIONS

This application claims priority to Korean Patent Application No. 10-2010-0129991, filed on Dec. 17, 2010, and all the benefits accruing therefrom under 35 U.S.C. §119, the disclosure of which is incorporated herein in its entirety by reference.

BACKGROUND

1. Field

Provided is thermoelectric materials including coating layers having a high performance index, methods of manufacturing the thermoelectric materials, and thermoelectric devices including the thermoelectric materials, and more particularly, thermoelectric materials including coating layers that exhibit improved thermoelectric performance, methods of manufacturing the thermoelectric materials, and thermoelectric devices including the thermoelectric materials.

2. Description of the Related Art

In general, thermoelectric materials are used in active cooling and waste heat power generation based on the Peltier effect and the Seebeck effect. The Peltier effect is a phenomenon in which, as illustrated in FIG. 1, phonon (heat) moves along with charge carriers (holes of a p-type material or electrons of an n-type material) when a current is made to flow through the materials, and thus cooling and heating occurs at each end of the materials. The Seebeck effect is a phenomenon in which, as illustrated in FIG. 2, charge carriers move along with heat (phonon flow), when temperature gradient is provided by an external heat source, and thus electric current flows through the materials (power generation).

The major advantages of cooling using a thermoelectric material are its lack of moving parts or circulating condensing liquid, its thermal controllability, and its small size. Therefore it is regarded as an environmentally friendly cooling method. The thermoelectric active cooling can be applied in refrigerant-free refrigerators, air conditioners, and various micro-cooling systems.

In addition, thermoelectric materials can be used to convert heat energy to electricity based on the Seebeck effect. Thus, waste heat can be collected for higher energy efficiency in many applications, including motor vehicles.

The performance of the thermoelectric materials is evaluated using a dimensionless thermoelectric figure of merit ZT defined by Equation 1.

$$ZT = \frac{S^2 \sigma T}{k} \quad \langle \text{Equation 1} \rangle$$

wherein S is a Seebeck coefficient, σ is an electrical conductivity, T is an absolute temperature, and k is a thermal conductivity.

To increase the ZT, a large Seebeck coefficient, high electrical conductivity, and low thermal conductivity are essential.

SUMMARY

Provided are nanocomposite-type thermoelectric materials having an improved power factor and low thermal conductivity due to a coating layer.

Provided are methods of manufacturing the thermoelectric materials including a coating layer.

Provided are thermoelectric modules including thermoelectric elements including the thermoelectric materials.

Provided are thermoelectric devices including the thermoelectric modules.

Additional aspects will be set forth in part in the description which follows and, in part, will be apparent from the description, or may be learned by practice of the presented embodiments.

Provided is a thermoelectric material which includes: a thermoelectric powder; and a coating layer on an outer surface of the thermoelectric powder.

The coating layer may be on a portion of the outer surface of the thermoelectric semiconductor powder or may completely cover the outer surface of the thermoelectric semiconductor powder.

An average particle size of the thermoelectric semiconductor powder may be from about 0.03 micrometer (μm) to about 100 micrometers (μm).

The thermoelectric semiconductor powder may include two or more elements selected from the group consisting of a transition metal, a rare-earth element, a Group 13 element, a Group 14 element, a Group 15 element, and a Group 16 element.

The coating layer may include a ceramic material.

The ceramic material may include an oxide or a nitride.

The coating layer may include a highly-conductive metal or alloy that has higher electrical conductivity than the thermoelectric semiconductor powder.

The highly-conductive metal or alloy may include at least one selected from the group consisting of copper (Cu), silver (Ag), gold (Au), indium (In), chromium (Cr), cobalt (Co), nickel (Ni), zinc (Zn), tin (Sn), antimony (Sb), tellurium (Te), and lead (Pb).

An electrical conductivity of the highly-conductive metal or alloy may be about 1000 Siemens per centimeter (S/cm) or more at room temperature.

The coating layer may include a thermoelectric semiconductor\

The thermoelectric semiconductor may include identical components to those of the thermoelectric semiconductor powder as described above.

The thermoelectric semiconductor may include two or more elements selected from the group consisting of a transition metal, a rare-earth element, a Group 13 element, a Group 14 element, a Group 15 element, and a Group 16 element.

The coating layer may be a single-layer.

An average thickness of the coating layer having the single-layer may be about 1 nanometer (nm) to about 100 nanometers (nm).

The coating layer may have a multilayer structure.

An average thickness of the coating layers of the multilayer structure may be about 2 nm to about 300 nm.

The multi-layer structure may have a superlattice structure.

The coating layer having a multi-layer structure may include two or more layers selected from the group consisting of a coating layer including a ceramic material, a coating layer including a highly-conductive metal or alloy that has a higher electrical conductivity than the thermoelectric semiconductor powder, and a coating layer including a thermoelectric semiconductor.

The thermoelectric material may have a bulk shape obtained by pressing/sintering the thermoelectric semiconductor powder covered by the coating layer.

Provided is a method of preparing a thermoelectric material. The method includes: preparing a thermoelectric semiconductor powder; forming a coating layer including a metal-containing inorganic material on the thermoelectric semiconductor powder by vapor deposition; and pressing/sintering the thermoelectric semiconductor powder on which the coating layer is formed.

The vapor deposition may include direct current ("DC") magnetron sputtering, radio frequency ("RF") sputtering, thermal/vacuum evaporation, ion plating, ion beam deposition, molecular beam epitaxy, electroplating, plasma spraying, laser ablation, E-beam ablation, metal-organic chemical vapor deposition, or hydride vapor phase epitaxy.

Provided is a thermoelectric module which includes: a thermoelectric element absorbing heat from the heat supplier; a first electrode contacting the thermoelectric element; and a second electrode facing the first electrode and contacting the thermoelectric element. The thermoelectric element includes the thermoelectric material as described above Provided is a thermoelectric device which includes: the thermoelectric module as described above and a heat supplier.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
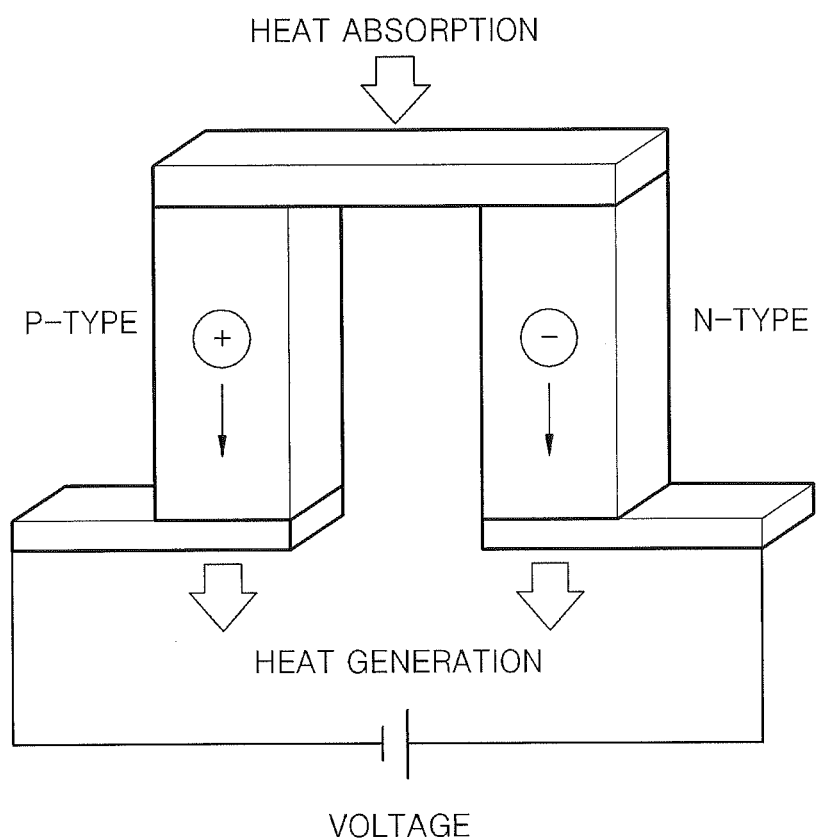
FIG. 1 is a schematic view for explaining thermoelectric cooling by the Peltier effect.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present invention.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

A thermoelectric material according to an embodiment of the present invention exhibits a thermoelectric performance that is improved by forming coating layers including a metal-containing inorganic material directly on an outer surface of a thermoelectric semiconductor powder.

In general, the thermoelectric efficiency is associated with the thermoelectric figure of merit ZT, defined as $ZT=(S^2\sigma/\kappa)T$, where S, $\sigma$, $\kappa$, and T are the Seebeck coefficient, electrical conductivity, thermal conductivity, and absolute temperature, respectively. To increase ZT, a large S, high $\sigma$, and low $\kappa$ are essential. However, there is a fundamental trade off between high Seebeck coefficient and high electrical conductivity for bulk materials based on the carrier concentration relationship.

However, by forming a nano-sized coating layer including a metal-containing inorganic material, on a thermoelectric semiconductor powder, the Seebeck coefficient may be increased due to a quantum confinement effect with no (or less) electrical conductivity reduction. In addition, the thermal conductivity may be decreased based on a phonon glass electron crystal ("PGEC") principle, thereby enhancing the thermoelectric performance.

The quantum confinement effect refers to a concept that the Seebeck coefficient is increased by increasing an effective mass, by increasing a density-of-states of carriers in a material without a substantial decrease in electrical conductivity. Due to the quantum confinement effect, the trade-off relationship between the electrical conductivity and the Seebeck coefficient collapses, thereby enabling the Seebeck coefficient to increase independently.

The PGEC principle refers to a concept that movement of phonons that deliver heat is blocked and movement of carriers, such as electrons or holes, is not intercepted so as to selectively reduce thermal conductivity only.

In order to use the quantum confinement effect and/or PGEC principle, the thermoelectric material according to an embodiment of the present invention is prepared by introducing nano-coating layers to a thermoelectric semiconductor powder and sintering the resultant thermoelectric semiconductor powder to form a bulk thermoelectric product.

The coating layer may cover (e.g., overlap) a portion of the surface of the thermoelectric semiconductor powder or may completely cover (e.g. overlap) the surface of the thermoelectric semiconductor powder, and may have a continuous structure or a discontinuous structure. A material for forming the coating layer may be an inorganic material, and examples thereof are a ceramic material, a highly-conductive metal or alloy that has higher electrical conductivity than the thermoelectric semiconductor powder, a thermoelectric semiconductor and a combination thereof.

A ceramic material as an example of the inorganic material is an insulating material, and may be, for example, an oxide or a nitride, and an example of the oxide is aluminum oxide, $SiO_2$, etc., and an example of the nitride is AlN, BN, etc.

A highly-conductive metal or alloy that has a higher electrical conductivity than the thermoelectric semiconductor powder as an example of the inorganic material may include at least one selected from the group consisting of copper (Cu), silver (Ag), gold (Au), indium (In), chromium (Cr), cobalt (Co), nickel (Ni), zinc (Zn), tin (Sn), antimony (Sb), tellurium (Te), and lead (Pb).

The highly-conductive metal may have an electrical conductivity of 1000 Siemens per centimeter (S/cm) or more at room temperature.

A thermoelectric semiconductor as an example of the inorganic material may include, for example, one or more thermoelectric semiconductors each having two or more elements selected from the group consisting of a transition metal, a rare-earth element, a Group 13 element, a Group 14 element, a Group 15 element, and a Group 16 element. Also, the thermoelectric semiconductor may consist of components which are used in the thermoelectric semiconductor powder.

Examples of the rare-earth element are Y, Ce, La, and a combination thereof, examples of the transition metal are Ti, Zr, Hf, V, Nb, Ta, Cr, Mo, W, Mn, Fe, Co, Ni, Cu, Zn, Ag, Re, and a combination thereof, examples of the Group 13 element are B, Al, Ga, In, and a combination thereof, examples of the Group 14 element are C, Si, Ge, Sn, Pb, and a combination thereof, examples of the Group 15 element are P, As, Sb, Bi, and a combination thereof, and examples of the Group 16 element are S, Se, Te, and a combination thereof.

Examples of a thermoelectric semiconductor having such elements are a Bi—Te based thermoelectric semiconductor, a Co—Sb based thermoelectric semiconductor, a Pb—Te based thermoelectric semiconductor, and a Sb—Te based thermoelectric semiconductor. Electrical characteristics of such thermoelectric semiconductors may be enhanced due to inclusion of at least one element selected from the group consisting of a transition metal, a rare-earth element, a Group 13 element, a Group 14 element, a Group 15 element, and a Group 16 element, as a dopant, therein. An example of the Bi—Te based thermoelectric semiconductor is a $(Bi,Sb)_2(Te,Se)_3$ based thermoelectric semiconductor using Sb and Se as dopants, an example of the Co—Sb based thermoelectric semiconductor is a $CoSb_3$ based thermoelectric semiconductor, examples of the Sb—Te based thermoelectric semiconductor are $AgSbTe_2$ and $CuSbTe_2$, and examples of the Pb—Te based thermoelectric semiconductor are PbTe and $(PbTe)mAgSbTe_2$.

The coating layer including the inorganic material may have a single-layer structure or a multi-layer structure including a plurality of the single-layer structures. If the coating layer has a single-layer structure, a mean thickness of the coating layer may be equal to or smaller than a mean free path of phonons of the thermoelectric semiconductor. If the mean thickness of the coating layer is equal to or smaller than a mean free path of phonons of the thermoelectric semiconductor, phonons are scattered by the coating layer while carriers are not interrupted, thereby enabling embodiment of the PGEC principle. The mean thickness of the single-layered coating layer may be from about 1 nanometer (nm) to about 100 nm, for example, about 1 nm to about 50 nm, about 1 nm to about 30 nm, or about 1 nm to about 10 nm. Accordingly, the thermal conductivity of the thermoelectric semiconductor is decreased and thus, high thermoelectric efficiency may be obtained. A mean thickness of a multi-layered coating layer may be, for example, from about 2 nm to about 300 nm. Also, the multi-layer structure may have a superlattice structure.

The single-layered coating layer may include, for example, only a coating layer including the ceramic material; only a coating layer including the highly-conductive metal or alloy that has higher electrical conductivity than the thermoelectric semiconductor powder as a major component; or only a coating layer including a thermoelectric semiconductor.

The coating layer of the ceramic material directly embodies the PGEC principle. If a metallic coating layer having a thickness that is equal to or smaller than a phonon mean free path, for example, about 1 nm to about 50 nm or less, or about 1 nm to about 30 nm or less is formed, phonons are scattered and carriers are not interrupted. Thus, in idealistic conditions, a power factor may be not changed. Accordingly, thermal conductivity is decreased and thus high thermoelectric figure of merit ZT may be obtained.

A thermoelectric material including coating layers of the highly-conductive metal or alloy that has a higher electrical conductivity than the thermoelectric semiconductor powder may embody the PGEC principle. Also, since the highly-conductive metal coating layer provides carriers to the thermoelectric semiconductor, electrical conductivity of the thermoelectric material may be increased. Although the Seebeck coefficient may be slightly decreased due to carrier density increase, ultimately, the power factor is increased. And the lattice thermal conductivity should be decreased due to the phonon scattering. Accordingly, high thermoelectric figure of merit ZT may be obtained.

A thermoelectric material including coating layers of other thermoelectric semiconductors may enhance the Seebeck coefficient due to the quantum confinement effect or carrier concentration adjustment of the coating layer of thermoelectric semiconductor. Thus, the power factor may be increased. Coating layers scatter phonons, reducing the lattice thermal conductivity, resulting in the thermoelectric figure of merit enhancement.

In order to obtain the effects of the various coating layers simultaneously, a multi-layer structure may be used. The multi-layer structure can be formed by depositing a single-layer coating repeatedly, and an optimal ZT value may be obtained by optimizing the multi-layer structure. In embodiments, for example, the Seebeck coefficient enhancement is achieved by coating a thermoelectric semiconductor, while the electrical conductivity can be increased by another coating layer of highly-conductive metal. Both type of coating layers should reduce thermal conductivity, therefore being able to maximize thermoelectric figure of merit ZT.

Also, a superlattice structure can be formed as coating layers to achieve enhancement of thermoelectric figure of merit ZT.

As described above, the coating layer including a metal-containing inorganic material is on the outer surface of the thermoelectric semiconductor powder, and any conventionally available material may be used as the thermoelectric semiconductor powder without limitation. The thermoelectric semiconductor powder may include one or more thermoelectric semiconductors each having two or more elements selected from the group consisting of a transition metal, a rare-earth element, a Group 13 element, a Group 14 element, a Group 15 element, and a Group 16 element. Examples of the rare-earth element are Y, Ce, La, and a combination thereof, examples of the transition metal are Ti, Zr, Hf, V, Nb, Ta, Cr, Mo, W, Mn, Fe, Co, Ni, Cu, Zn, Ag, Re, and a combination thereof, examples of the Group 13 element are B, Al, Ga, In, and a combination thereof, examples of the Group 14 element are C, Si, Ge, Sn, Pb, and a combination thereof, examples of the Group 15 element are P, As, Sb, Bi, and a combination thereof, and examples of the Group 16 element are S, Se, Te, and a combination thereof.

Examples of a thermoelectric semiconductor having such elements are a Bi—Te based thermoelectric semiconductor, a Co—Sb based thermoelectric semiconductor, a Pb—Te based thermoelectric semiconductor, and a Sb—Te based thermoelectric semiconductor. Electrical characteristics of such thermoelectric semiconductors may be enhanced due to inclusion of at least one element selected from the group consisting of a transition metal, a rare-earth element, a Group 13 element, a Group 14 element, a Group 15 element, and a Group 16 element, as a dopant, therein.

An example of the Bi—Te based thermoelectric semiconductor is a $(Bi,Sb)_2(Te,Se)_3$ based thermoelectric semiconductor using Sb and Se as dopants, an example of the Co—Sb based thermoelectric semiconductor is a $CoSb_3$ based thermoelectric semiconductor, examples of the Sb—Te based thermoelectric semiconductor are $AgSbTe_2$ and $CuSbTe_2$, and examples of the Pb—Te based thermoelectric semiconductor are PbTe and $(PbTe)mAgSbTe_2$.

The thermoelectric semiconductor powder may have a predetermined size, for example, an average particle size of the thermoelectric semiconductor powder may be from about 0.03 micrometer (μm) to about 100 micrometers (μm).

The thermoelectric semiconductor powder may be prepared by using various methods, and some of the methods are described below:

a method using an ampoule, in which raw materials are loaded into an ampoule made of a quartz or metal tube and then the ampoule is sealed by vacuum, followed by heating;

an arc melting method, in which raw materials are loaded into a chamber and then melted by arc discharging in an inert gas atmosphere;

a method using a solid state reaction, in which powders are, in one method, sufficiently mixed and processed to obtain a hard product, followed by heating, or in another method, the mixed powder is heated, processed, and then sintered;

a metal flux method for crystal growth, in which an element that provides a condition under which raw materials sufficiently grow into a crystal at a high temperature is loaded into a crucible, followed by heating at high temperature to grow crystals;

a Bridgeman method for crystal growth, in which raw materials are loaded into a crucible and then an end of the crucible is heated at a high-temperature until source elements are melted, and then, the high temperature region is slowly shifted, thereby locally melting the source elements until the entire source elements are exposed to the high-temperature region;

a zone melting method for crystal growth, wherein raw materials are formed into a seed rod and a feed rod and then a melting zone is slowly shifted upward to grow crystals;

a vapor transport method for crystal growth, in which raw materials are loaded into a lower portion of a quartz tube and then the lower portion of the quartz tube is heated while the temperature of an upper portion of the quartz tube is maintained at low levels. In this case, as the source materials evaporate, a solid phase reaction occurs at lower temperature to grow crystals; and a mechanical alloying method, in which raw powders and steal balls are placed in a jar formed of cemented carbide, and due to rotation, the steel balls mechanically collide with the source powder, thereby alloying the source powder.

After thermoelectric semiconductor powders are prepared by using the methods as described above, the powders are classified using a mechanical sieve according to an average particle size for application purposes.

The thermoelectric semiconductor powders prepared described above may be covered by coating layers. As a coating layer formation method, any physical vapor deposition or chemical vapor deposition that enables formation of nano thin films on the particle structures may be used, and examples of the method include direct current ("DC") magnetron sputtering, radio frequency ("RF") sputtering, thermal/vacuum evaporation, ion plating, ion beam deposition, molecular beam epitaxy, electroplating, plasma spraying, laser ablation, E-beam ablation, metal-organic chemical vapor deposition, and hydride vapor phase epitaxy.

Figure 3:
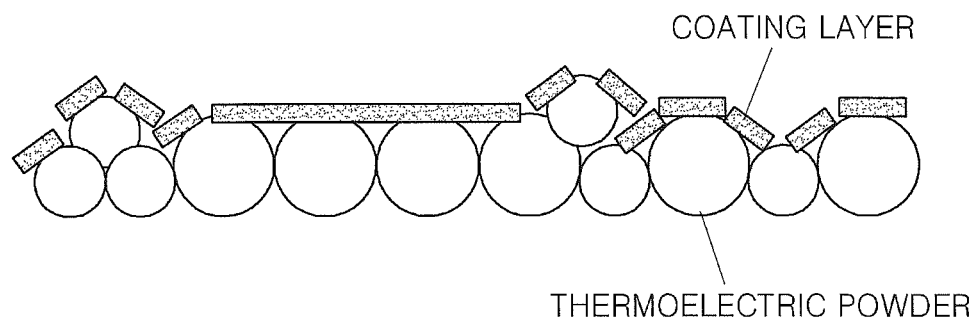
FIG. 3 illustrates an embodiment of a process of depositing a nano-coating layer on thermoelectric semiconductor powder.

FIG. 3 illustrates an example of a process of forming coating layers directly on an outer surface of thermoelectric semiconductor powders. Referring to FIG. 3, thermoelectric semiconductor powders are dispersed on a template substrate (not shown) and then, a coating layer may be formed directly thereon by deposition, such as sputtering.

Figure 4:
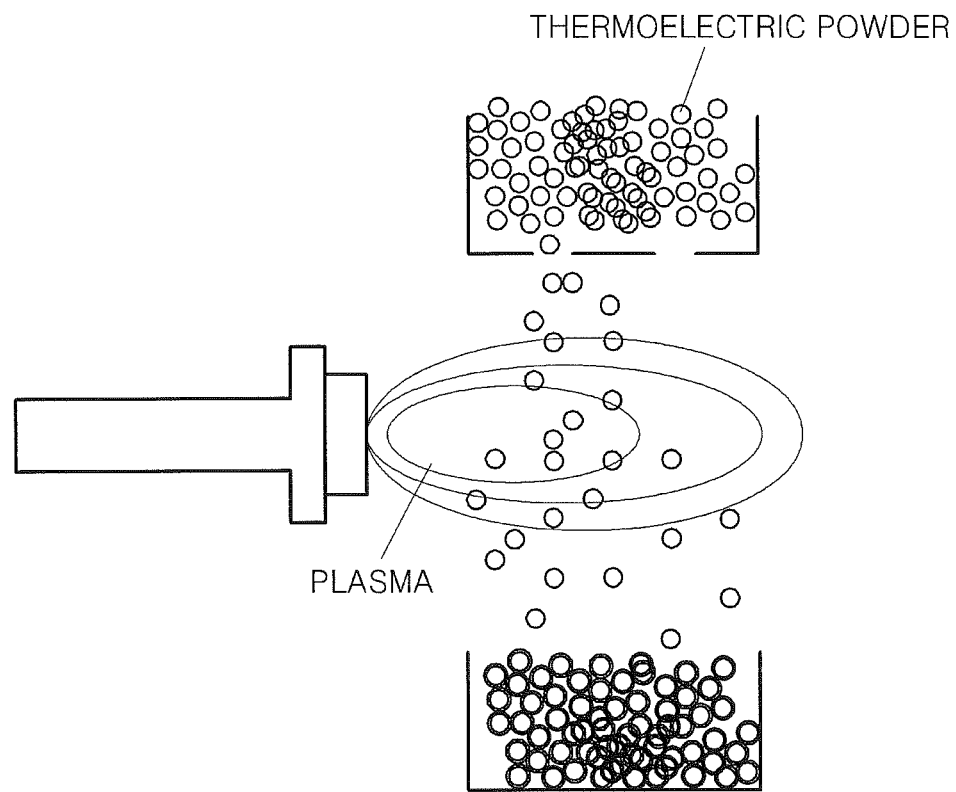
FIG. 4 illustrates another embodiment of a process of depositing a nano-coating layer on thermoelectric semiconductor powder.

FIG. 4 illustrates another example of a process of forming coating layers directly on the outer surface of the thermoelectric semiconductor powders. Referring to FIG. 4, the thermoelectric semiconductor powders drop or fly while spraying plasma thereto to form coating layers on the outer surface of the thermoelectric semiconductor powders.

These processes may be performed just once, or several times.

Figure 5A:
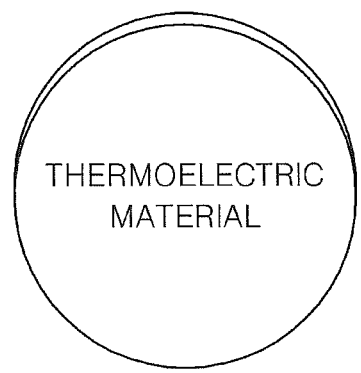
FIGS. 5A to 5C illustrate thermoelectric semiconductor powders, on which a nano-coating layer is deposited, according to embodiments of the present invention.
Figure 5B:
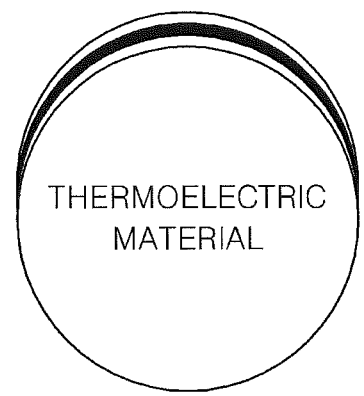
Figure 5C:
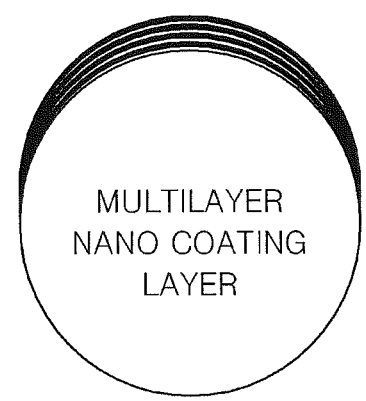

FIG. 5A illustrates an example of a coating layer having a single-layer structure formed by using the coating layer formation processes as described above, FIG. 5B illustrates an example of a coating layer having a multi-layer structure formed by using the coating layer formation processes as described above, and FIG. 5C illustrates an example of a coating layer having a superlattice structure formed by using the coating layer formation processes as described above.

Thereafter, the coated thermoelectric semiconductor powders are sintered to produce a bulk thermoelectric material in which nano-coating layers are dispersed. The sintering may be performed under a sintering condition that is generally used in the art. In one embodiment, for example, the Bi—Sb—Te based thermoelectric semiconductor as described above may be formed under a pressure of a few megapascals (MPa) to hundreds of MPa at a temperature of about 350 degrees Celsius (° C.) to about 490° C. for about 5 minutes to about 60 minutes.

Figure 6A:
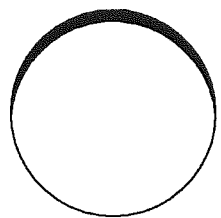
FIG. 6A shows a schematic image of thermoelectric semiconductor powder, on which a nano-coating layer is formed.
Figure 6B:
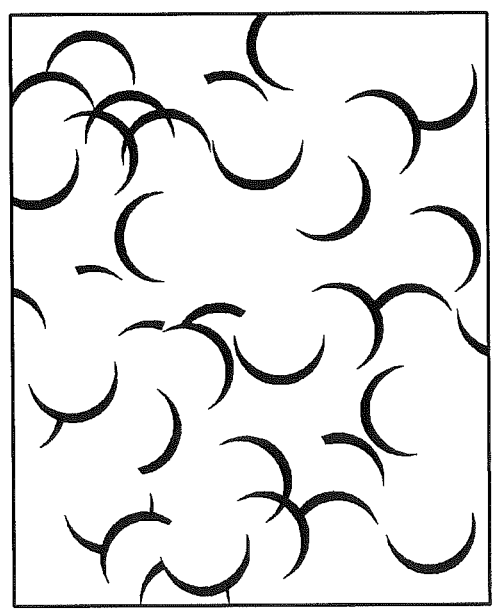
FIG. 6B is a schematic sectional view of a bulk thermoelectric material formed by sintering thermoelectric material powder, on which a nano-coating layer is formed.
Figure 6C:
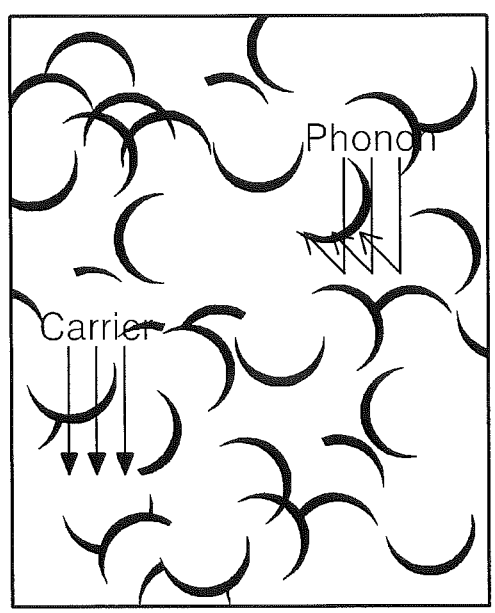
FIG. 6C shows a schematic view illustrating a mechanism in which phonons and carriers move in the bulk thermoelectric material formed by sintering thermoelectric material powder, on which a nano-coating layer is formed.

FIG. 6A shows a schematic image of a thermoelectric semiconductor powder particle covered by a nano-coating layer, FIG. 6B is a schematic sectional view of a bulk thermoelectric material formed by sintering thermoelectric material powders covered by nano-coating layers, and FIG. 6C shows a schematic view illustrating a mechanism in which phonons and carriers move in a bulk thermoelectric material formed by sintering thermoelectric material powders covered by nano-coating layers.

Figure 7A:
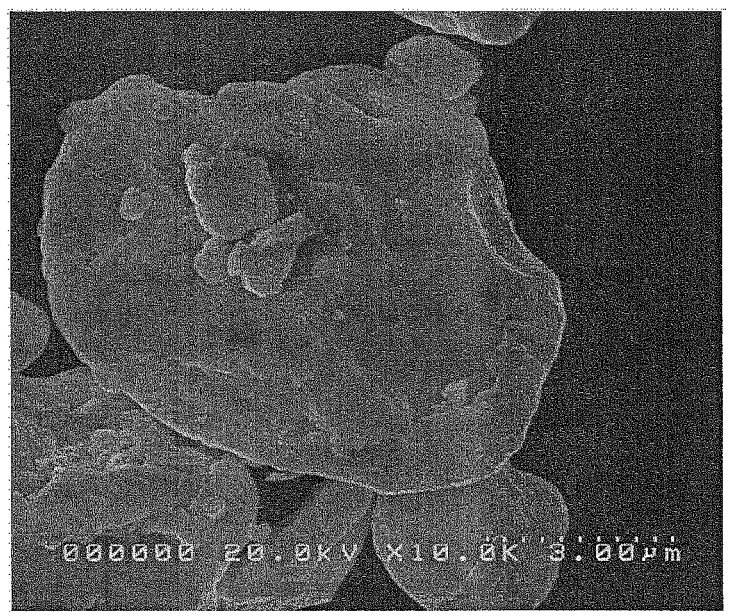
FIG. 7A is a scanning electron microscopy ("SEM") image of thermoelectric semiconductor powder before a coating layer is formed.
Figure 7B:
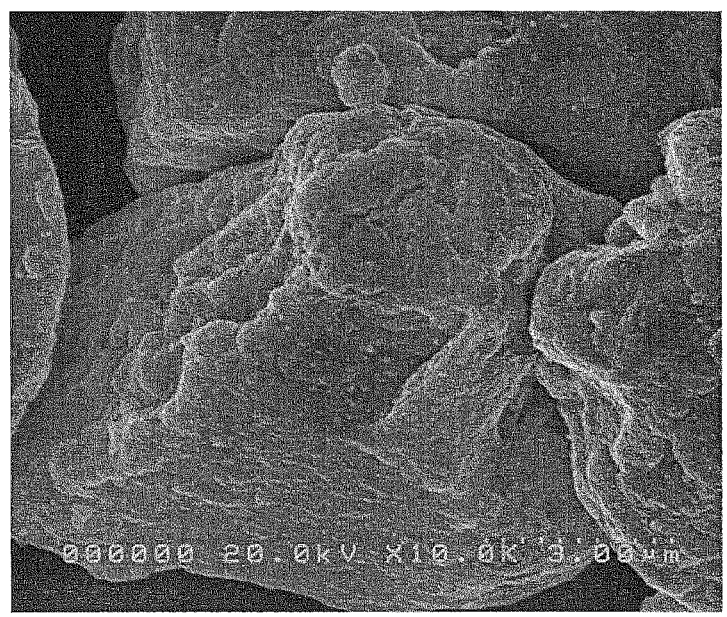
FIG. 7B is a SEM image of thermoelectric semiconductor powder coated with a metal film.
Figure 8:
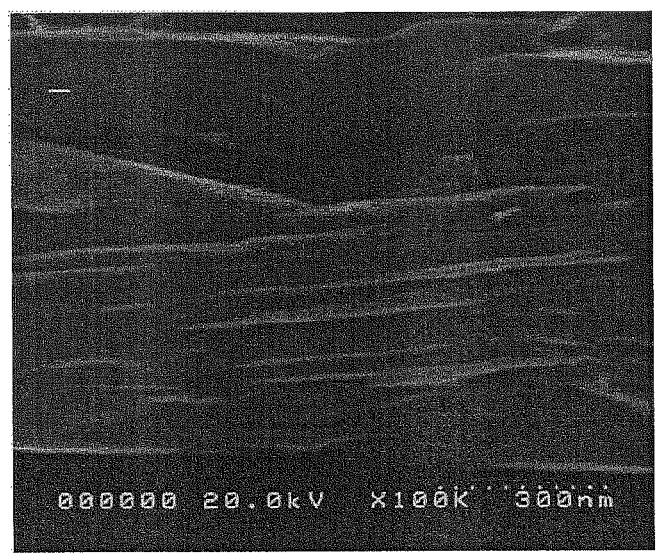
FIG. 8 is a SEM image of a cross-section of a multi-layered coating layer.

As an example of the thermoelectric semiconductor powders on which a single-layer coating layer is formed, FIG. 7A shows a scanning electron microscopy ("SEM") image of thermoelectric semiconductor powder ($Bi_{0.5}Sb_{1.5}Te_3$) before coating layers are deposited, FIG. 7B shows a SEM image of thermoelectric semiconductor powders covered by Bi at a thickness of about 50 nm by pulsed laser deposition, and FIG. 8 shows a SEM image of an example of thermoelectric semiconductor powder covered by a multi-layer coating layer: about 13 nm $Bi_{0.5}Sb_{1.5}Te_3$— about 6 nm Ag X 25.

A thermoelectric element according to an embodiment of the present invention is obtained by molding a thermoelectric material. In one embodiment, for example, the thermoelectric element may be formed by cutting a thermoelectric material. The thermoelectric element may be a p-type thermoelectric element or an n-type thermoelectric element. The thermoelectric element may be a structure obtained by forming a thermoelectric material in a predetermined shape, for example, a rectangular shape.

The thermoelectric element may be connected to electrodes and, when a current is made to flow, the thermoelectric element shows a cooling effect. Also, the thermoelectric element shows power generation effects due to a device or a temperature difference.

Figure 9:
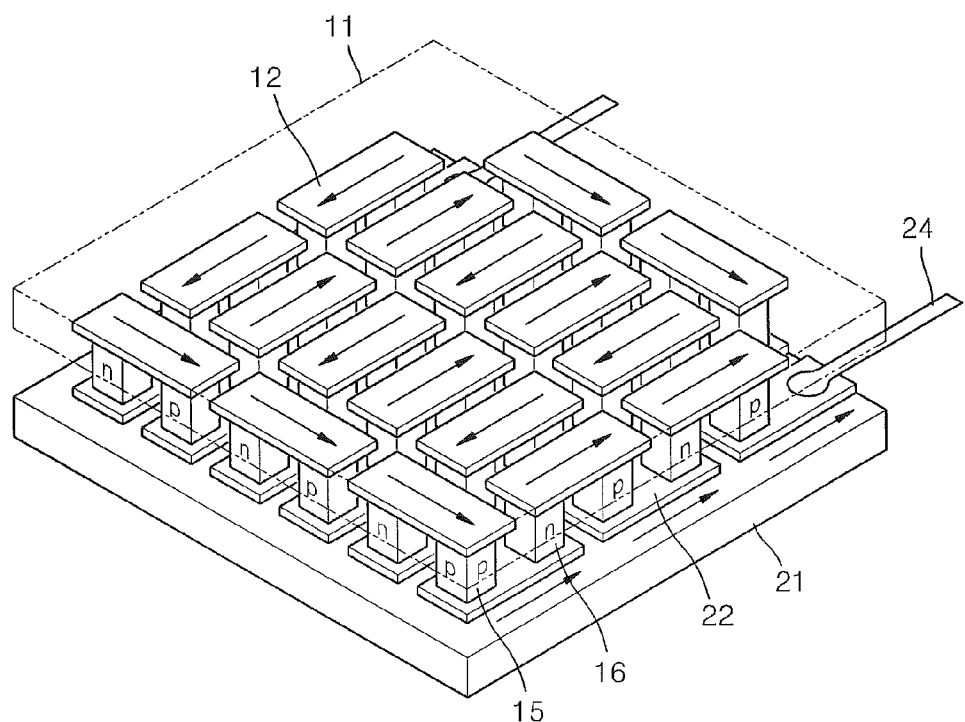
FIG. 9 is a perspective view of a thermoelectric module according to an embodiment of the present invention.

FIG. 9 is a thermoelectric module including the thermoelectric element, according to an embodiment of the present invention. Referring to FIG. 9, a top electrode 12 and a bottom electrode 22 are patterned on a top insulating substrate 11 and a bottom insulating substrate 21, respectively. The top electrode 12 and the bottom electrode 22 each contact both a p-type thermoelectric element 15 and an n-type thermoelectric element 16. The top electrode 12 and the bottom electrode 22 are connected to the outside the thermoelectric module through a lead electrode 24.

The top and bottom insulating substrates 11 and 21 may include gallium arsenic (GaAs), sapphire, silicon, glass (such as Pyrex®), or quartz. The top and bottom electrodes 12 and 22 may include aluminum, nickel, gold, or titanium, and may have various sizes (e.g., length, width, thickness, planar shape, etc.). The top and bottom electrodes 12 and 22 may be formed by using various known patterning methods, such as a lift-off semiconductor process, a deposition method, or a photolithography method.

Figure 2:
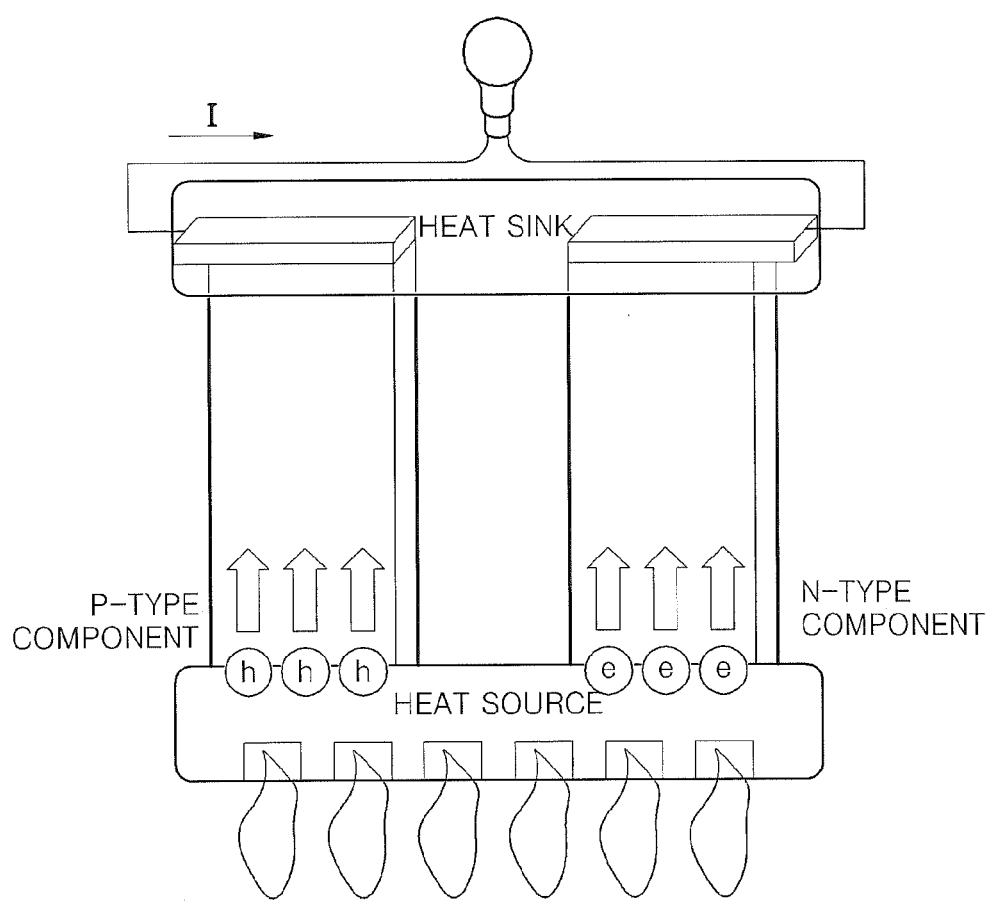
FIG. 2 is a schematic view for explaining thermoelectric power generation by the Seebeck effect.

A thermoelectric module according to another embodiment of the present invention, as illustrated in FIGS. 1 and 2, includes a first electrode, a second electrode, and a thermoelectric material represented by Equation 1 interposed between the first and second electrodes. The thermoelectric module may further include an insulating substrate on which at least one electrode of the first electrode and the second electrode is located as illustrated in FIG. 9. The insulating substrate may be the same as described above.

In a thermoelectric module according to an embodiment of the present invention, one of the first electrode and the second electrode may be exposed to a heat supplier as illustrated in FIGS. 1 and 2. In a thermoelectric module according to an embodiment of the present invention, one of the first electrode and the second electrode may be electrically connected to either an electric power supplier as illustrated in FIG. 1, or an external device outside thermoelectric module including the thermoelectric element, for example, an electrical device (for example, battery) that consumes or stores electric power.

In a thermoelectric module according to an embodiment of the present invention, one of the first electrode and the second electrode may be electrically connected to an electric power supplier as illustrated in FIG. 1.

In a thermoelectric module according to an embodiment of the present invention, a p-type thermoelectric element and an n-type thermoelectric element may be alternatively aligned as illustrated in FIG. 9, and at least one of the p-type thermoelectric element and the n-type thermoelectric element may include the thermoelectric material including coating layers. As illustrated in FIG. 9, the p-type and n-type elements alternate in rows longitudinally extending in a first direction, and in columns longitudinally extending in a second direction crossing the first direction.

A thermoelectric device according to an embodiment of the present invention includes a heat supplier and the thermoelectric module. The thermoelectric module includes a thermoelectric material that absorbs heat from the heat supplier and includes coating layers, a first electrode, and a second electrode which faces the first electrode. One of the first electrode and the second electrode may contact the thermoelectric material.

An example of the thermoelectric device may further include an electric power supplier electrically connected to the first electrode and the second electrode. Also, one of the first and second electrodes may be additionally electrically connected to another electric device.

The thermoelectric materials, thermoelectric elements, thermoelectric modules, and thermoelectric devices may be for example, thermoelectric cooling systems or thermoelectric power generation systems. The thermoelectric cooling system may be a micro-cooling system, a generally used cooling device, air conditioners or a waste heat power generation system, but is not limited thereto. The structure and manufacturing method of the thermoelectric cooling system are well known in the art and thus, will not be described in detail herein.

One or more embodiments of the present invention will be described in further detail with reference to the following examples. These examples are for illustrative purposes only and are not intended to limit the scope of the one or more embodiments of the present invention.

Preparation Example 1

Preparation of Thermoelectric Semiconductor Powder

Bi, Sb, and Te were measured at a mole ratio of 0.5:1.5:3, and then placed together with steel balls in a jar formed of cemented carbide and rotated to prepare a thermoelectric semiconductor powder having a composition of $Bi_{0.5}Sb_{1.5}Te_3$. The obtained thermoelectric semiconductor powder was subjected to a 325-mesh mechanical sieve (−325 mesh) to prepare thermoelectric semiconductor powder having an average diameter of about 30 μm.

Comparative Example 1

The thermoelectric semiconductor powder prepared according to Preparation Example 1 was sintered by spark plasma sintering at a temperature of 380° C., for 10 minutes, at a pressure of 70 MPa, under vacuum conditions, to prepare a thermoelectric semiconductor ($Bi_{0.5}Sb_{1.5}Te_3$).

Example 1

About 0.5 gram (g) of the thermoelectric semiconductor powder prepared according to Preparation Example 1 was uniformly dispersed on a 4-inch silicon (Si) wafer, and a plurality of the wafers on which the thermoelectric semiconductor powder was dispersed were placed in a DC reactive sputtering device, and $Al_2O_3$ was deposited thereon using an aluminum (Al) target in an oxygen atmosphere at a power of 100 watts (W) for 30 seconds.

After the deposition, the thermoelectric semiconductor powder coated with the coating layer on the Si wafers was collected and sintered by spark plasma sintering at a temperature of 380° C., for 10 minutes, at a pressure of 70 MPa, under vacuum conditions, thereby completing manufacture of a thermoelectric material including an $Al_2O_3$ layer having a thickness of about 10 nm as a ceramic coating layer.

The Seebeck coefficient (S) in microvolts per Kelvin (μV/K), electrical conductivity (σ) in terms of Siemens per centimeter (S/cm), power factor (PF) in watts per meter per Kelvin squared ($W/mK^2$), thermal conductivity in watts per meter per Kelvin (W/mK), lattice thermal conductivity in W/mK, and dimensionless thermoelectric figure of merit ZT of the thermoelectric material were measured and results thereof with respect to temperature in Kelvin (K) are shown in FIGS. 10A, 10B, 10C, 10D, 10E, and 10F. The results are compared with, as a standard, the thermoelectric material prepared according to Comparative Example 1.

The thermal conductivity and the lattice thermal conductivity were evaluated by measuring thermal diffusivity by using a laser flash method, the Seebeck coefficient and the electrical conductivity were measured by using a 4-terminal method, and the power factor and the thermoelectric figure of merit ZT were evaluated using the measurement results.

Figure 10A:
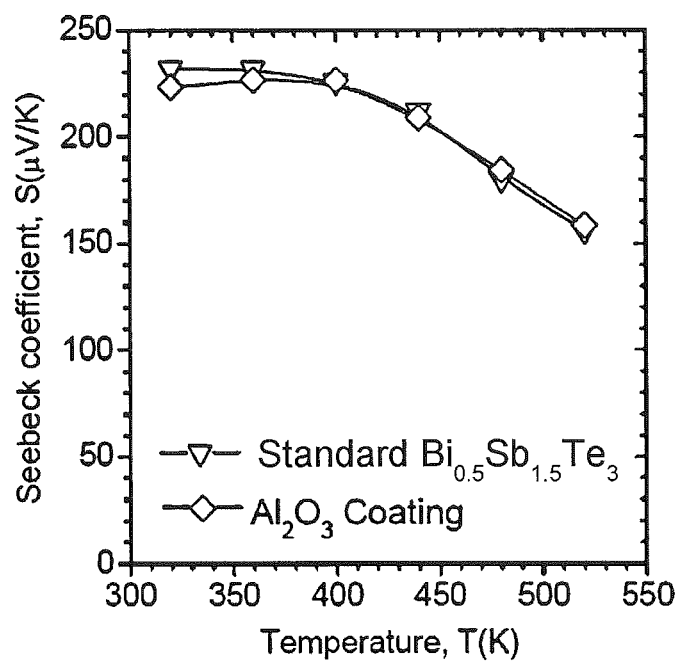
FIGS. 10A to 10F are graphs of a Seebeck coefficient, electrical conductivity, power factor, thermal conductivity, lattice thermal conductivity, and thermoelectric figure of merit ZT of a thermoelectric material prepared according to Example 1, respectively.
Figure 10B:
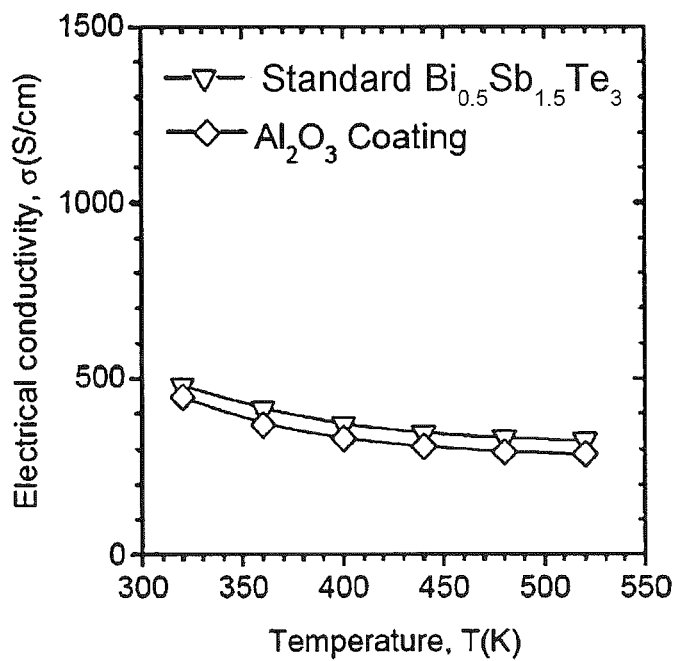
Figure 10C:
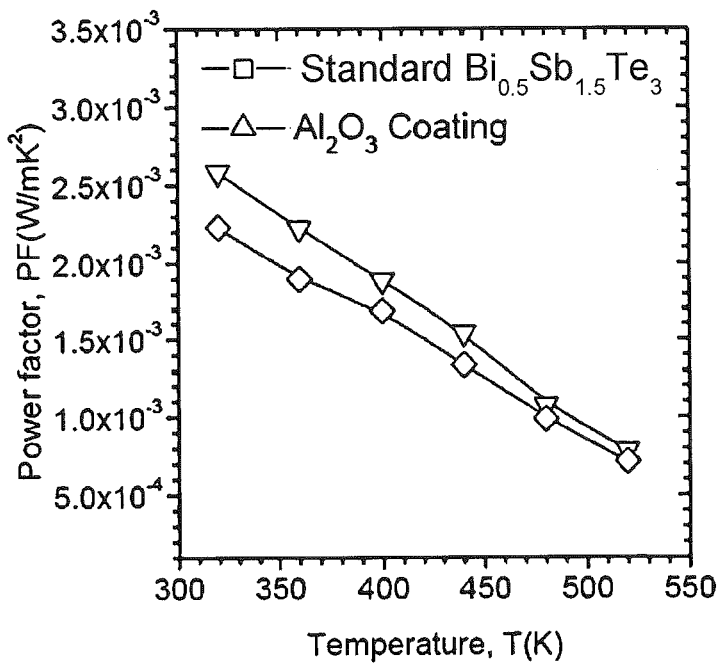
Figure 10D:
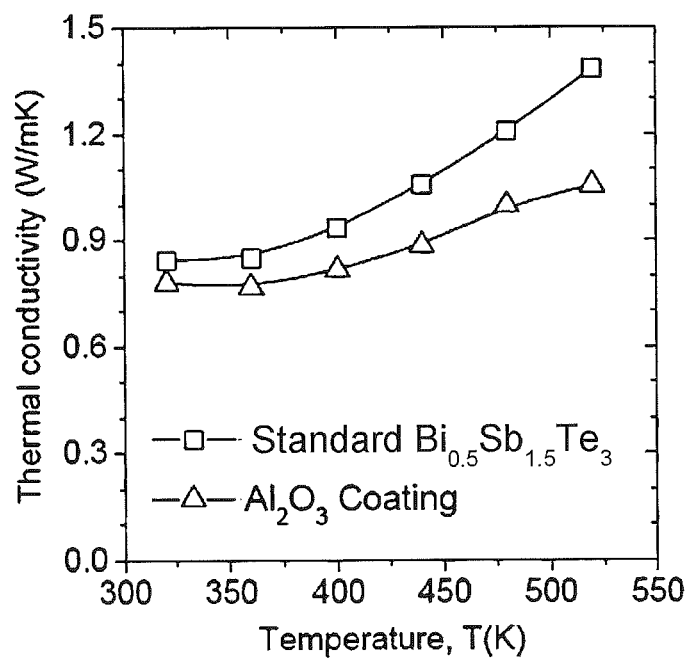
Figure 10E:
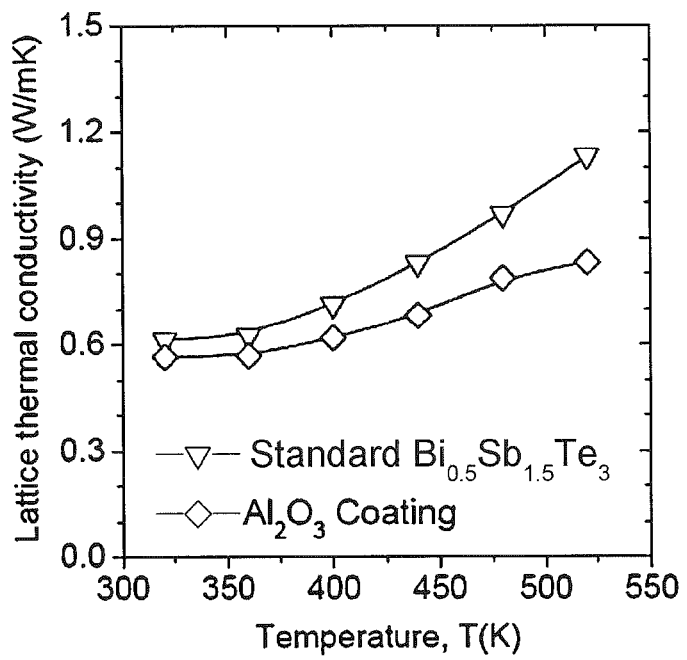
Figure 10F:
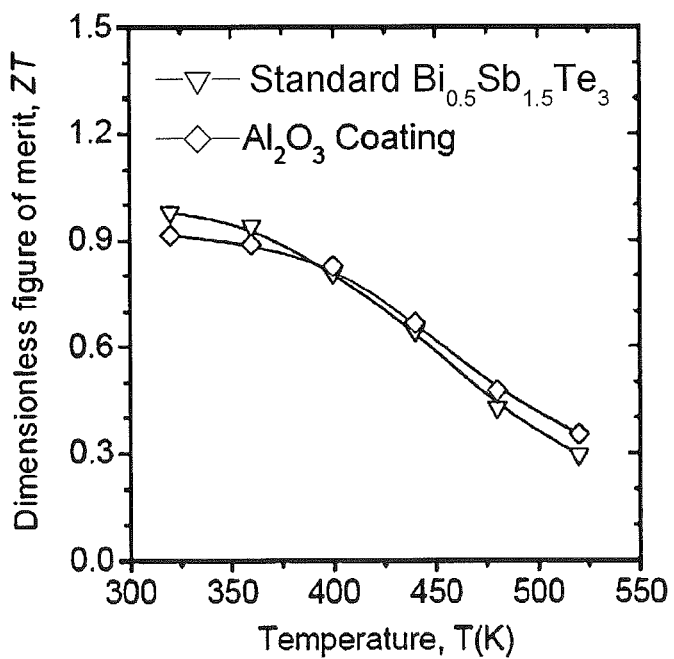
Figure 11A:
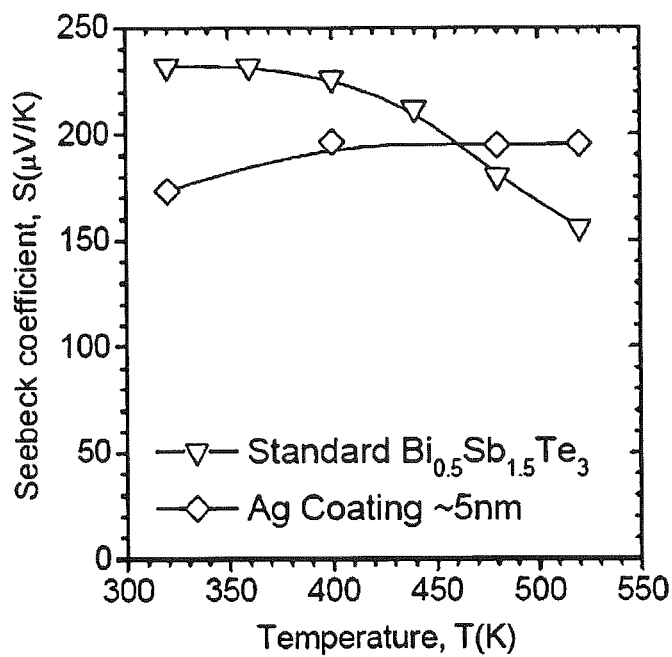
FIGS. 11A to 11F are graphs of the Seebeck coefficient, electrical conductivity, power factor, thermal conductivity, lattice thermal conductivity, and thermoelectric figure of merit ZT of a thermoelectric material prepared according to Example 2, respectively.
Figure 11B:
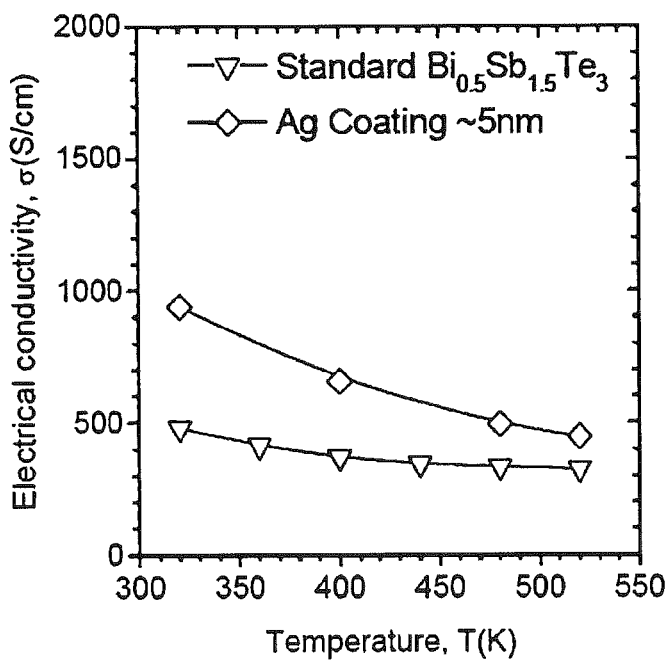
Figure 11C:
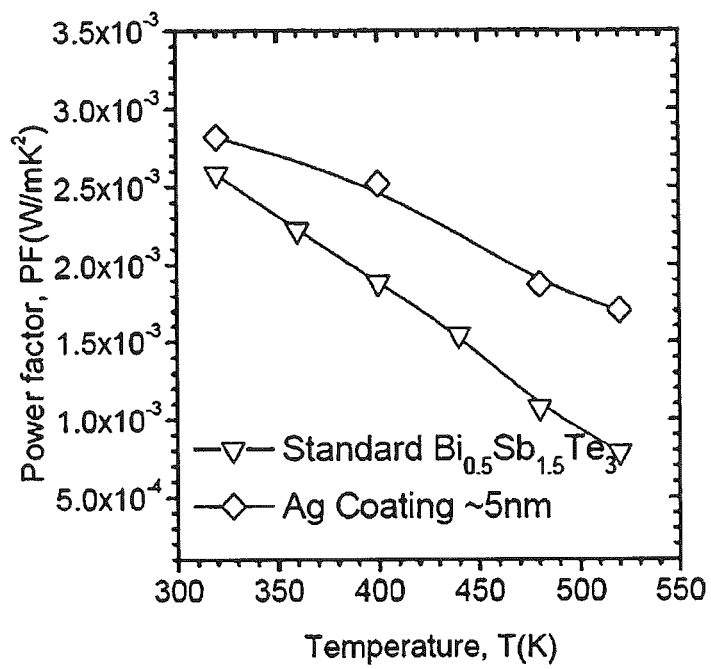
Figure 11D:
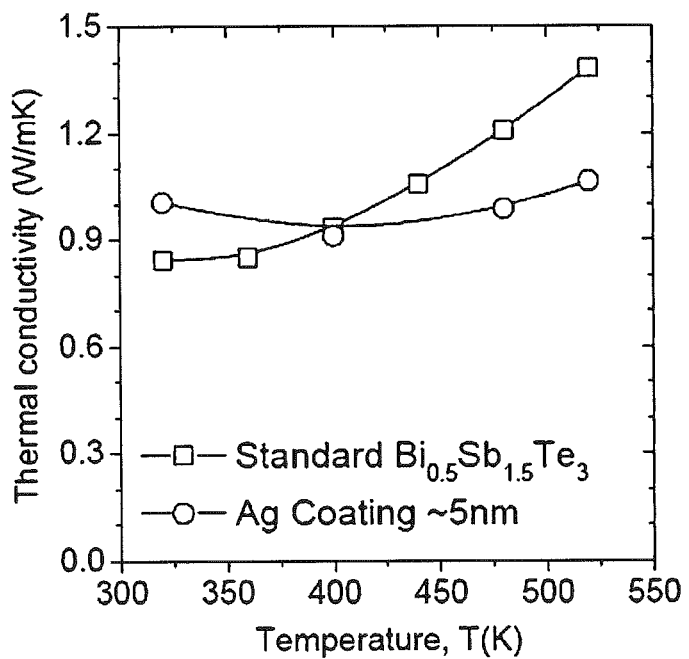
Figure 11E:
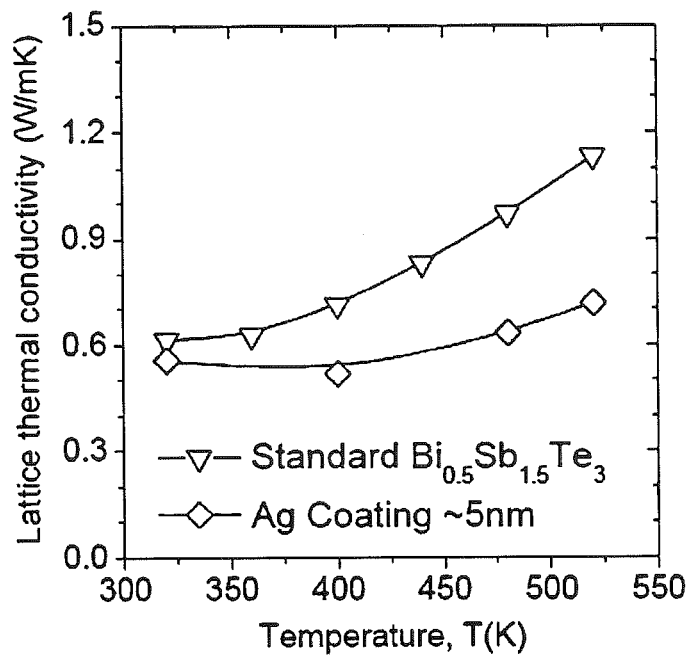
Figure 11F:
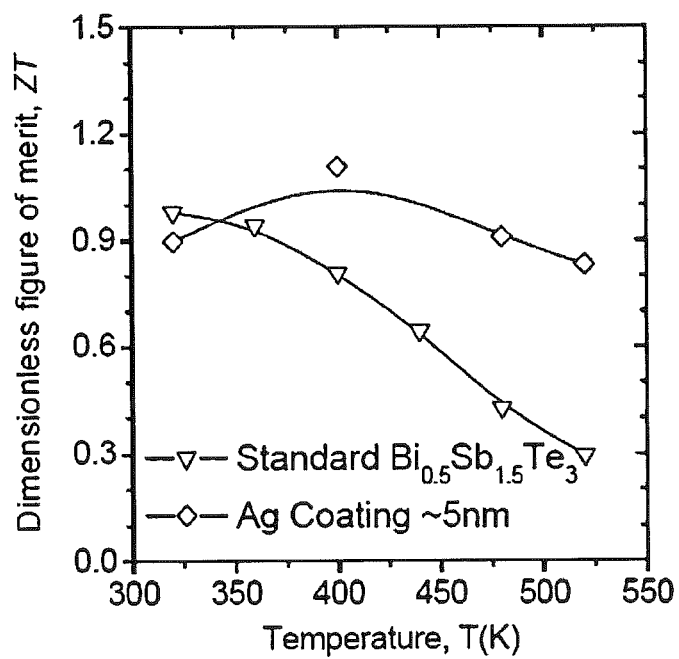
Figure 12A:
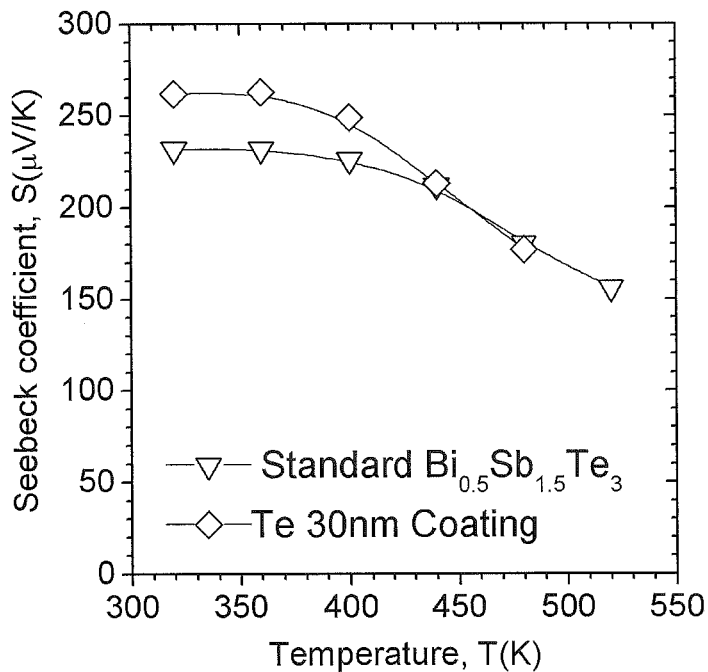
FIGS. 12A to 12F are graphs of the Seebeck coefficient, electrical conductivity, power factor, thermal conductivity, lattice thermal conductivity, and thermoelectric figure of merit ZT of a thermoelectric material prepared according to Example 3, respectively.
Figure 12B:
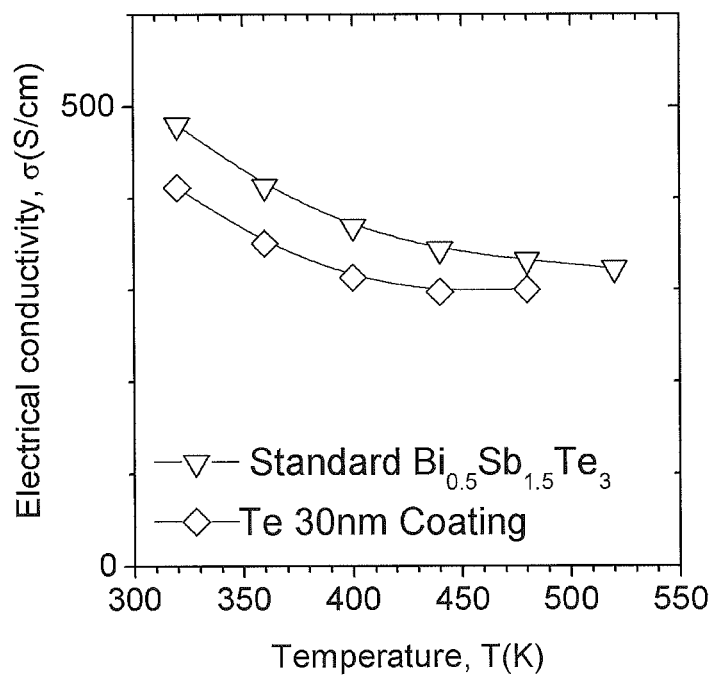
Figure 12C:
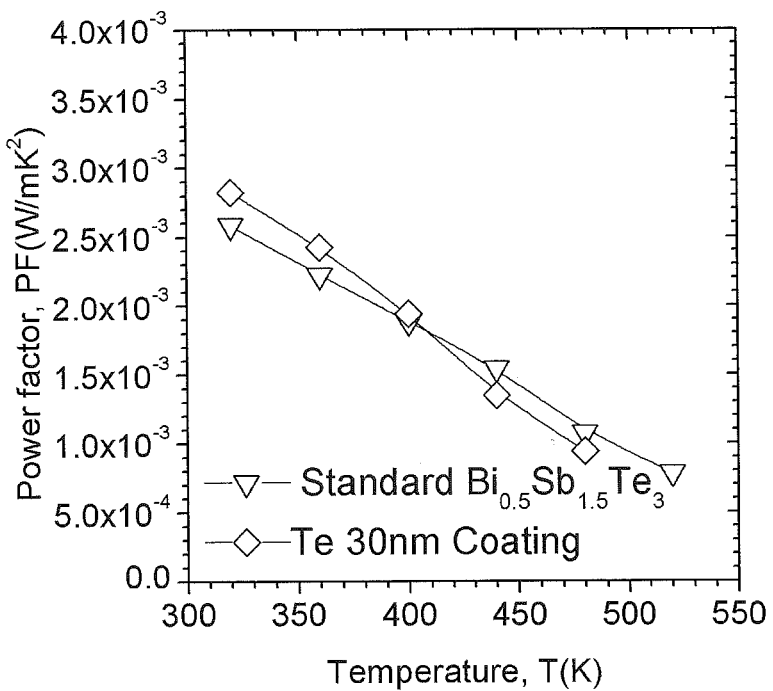
Figure 12D:
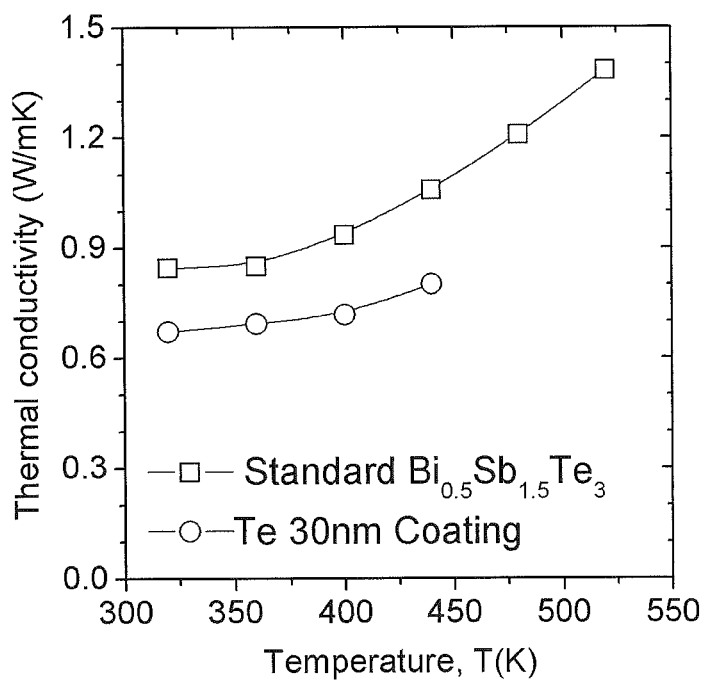
Figure 12E:
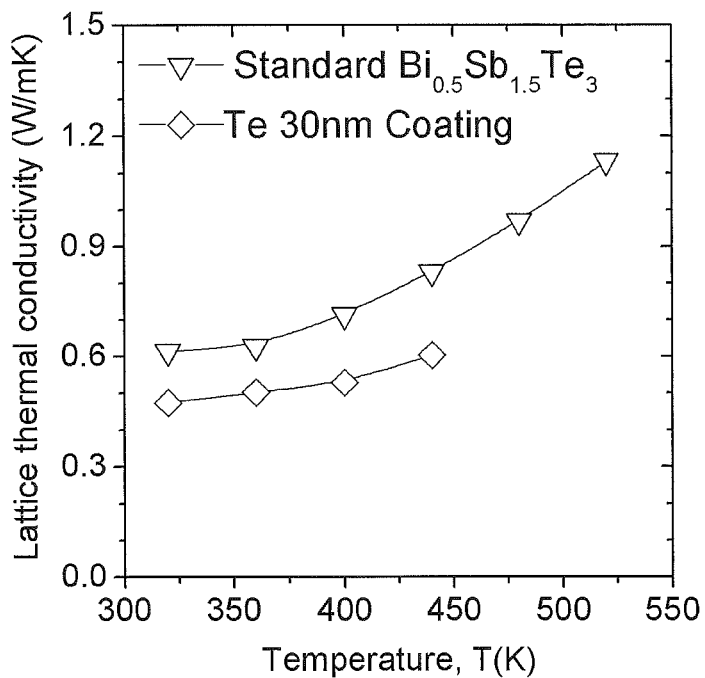
Figure 12F:
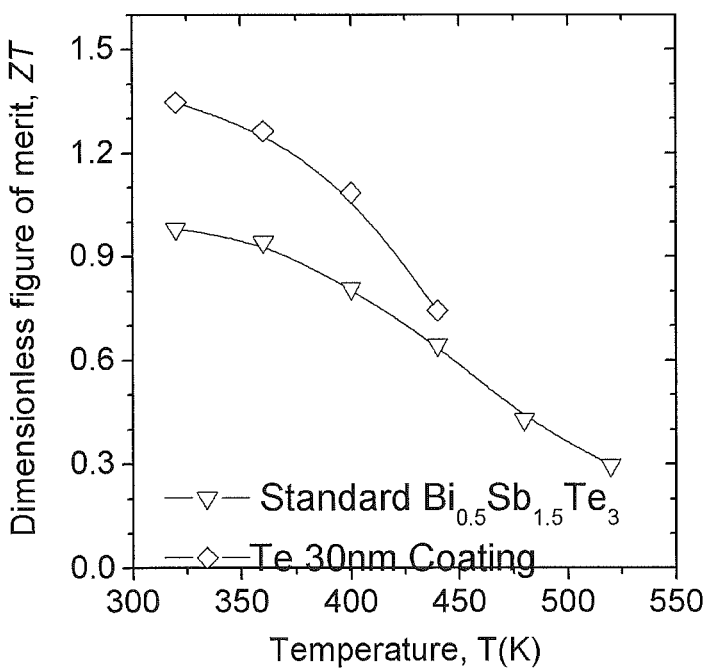
Figure 13A:
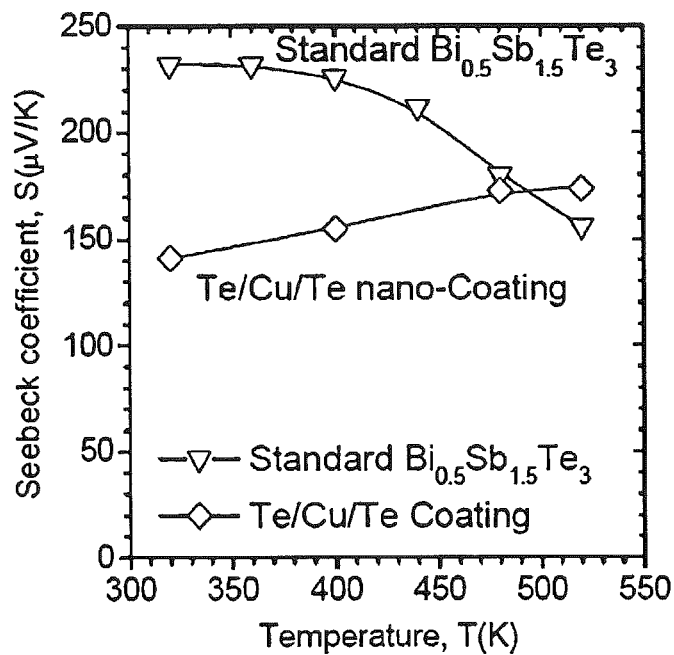
FIGS. 13A to 13F are graphs of the Seebeck coefficient, electrical conductivity, power factor, thermal conductivity, lattice thermal conductivity, and thermoelectric figure of merit ZT of a thermoelectric material prepared according to Example 4, respectively.
Figure 13B:
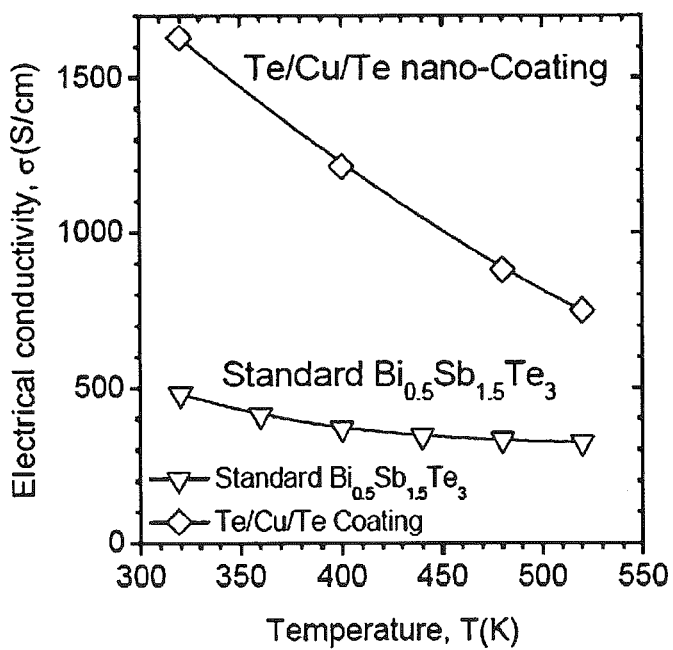
Figure 13C:
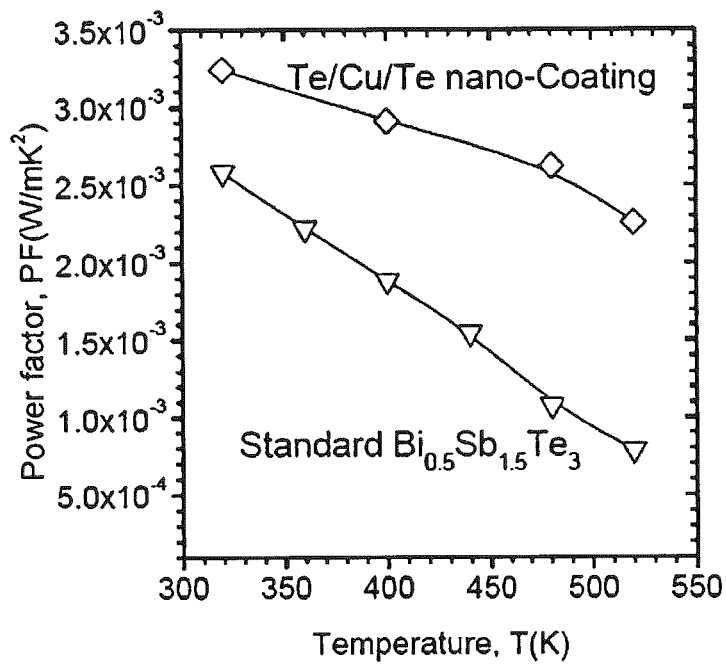
Figure 13D:
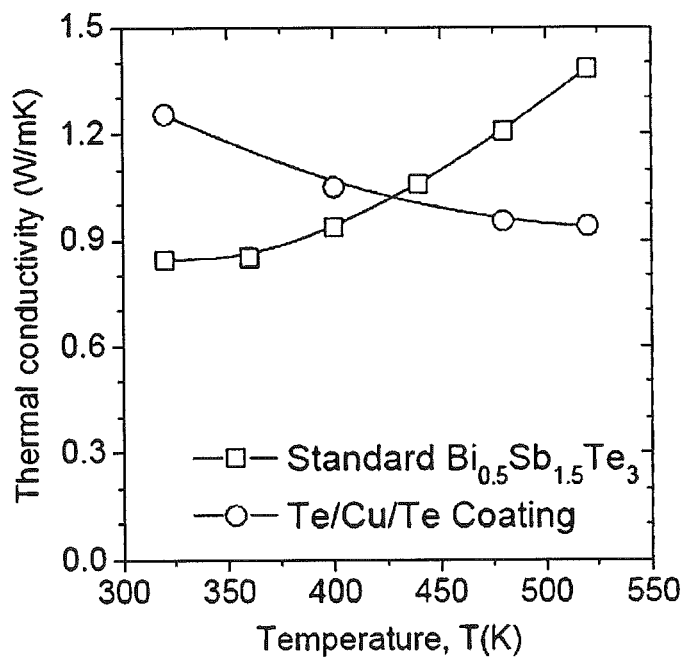
Figure 13E:
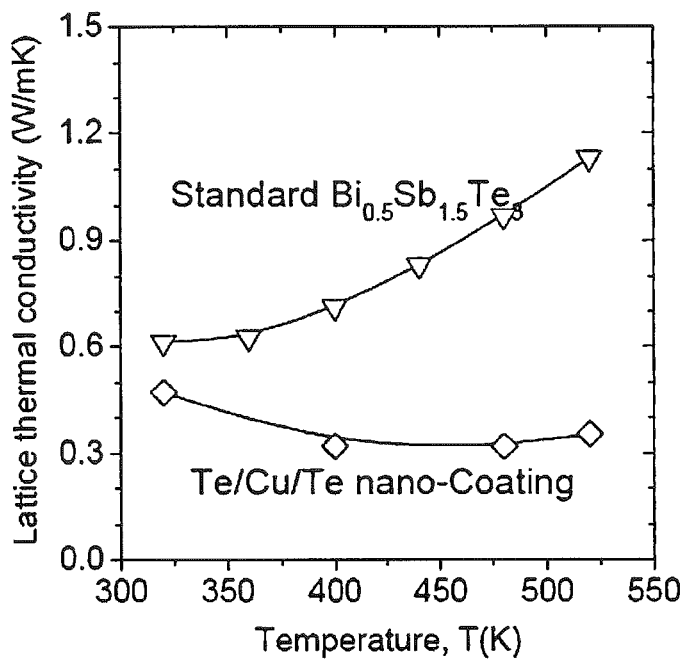
Figure 13F:
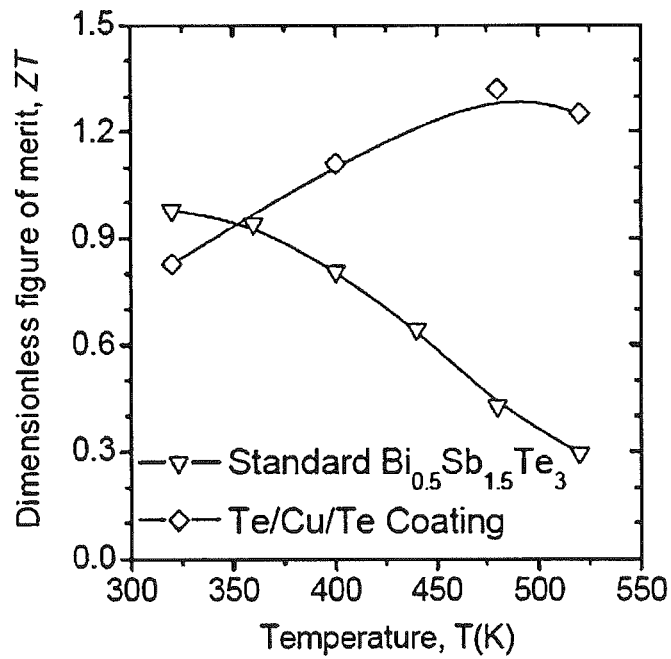
Figure 14A:
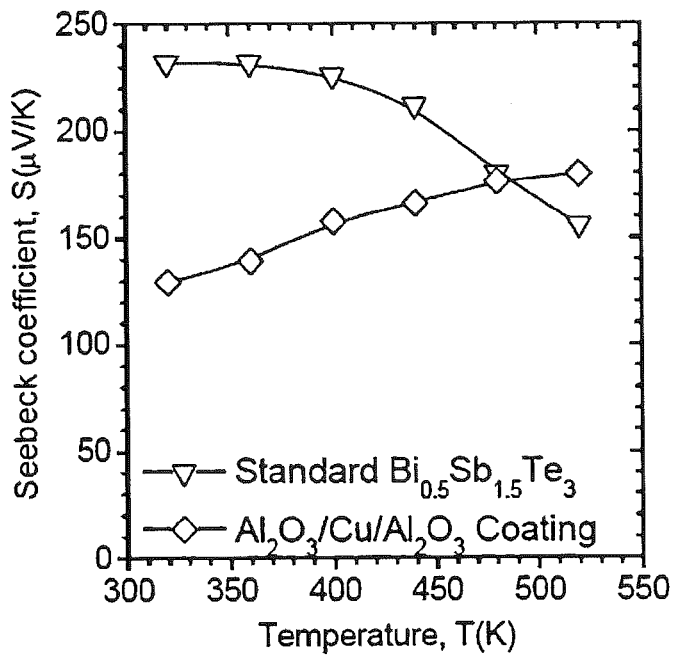
FIGS. 14A to 14F are graphs of the Seebeck coefficient, electrical conductivity, power factor, thermal conductivity, lattice thermal conductivity, and thermoelectric figure of merit ZT of a thermoelectric material prepared according to Example 5, respectively.
Figure 14B:
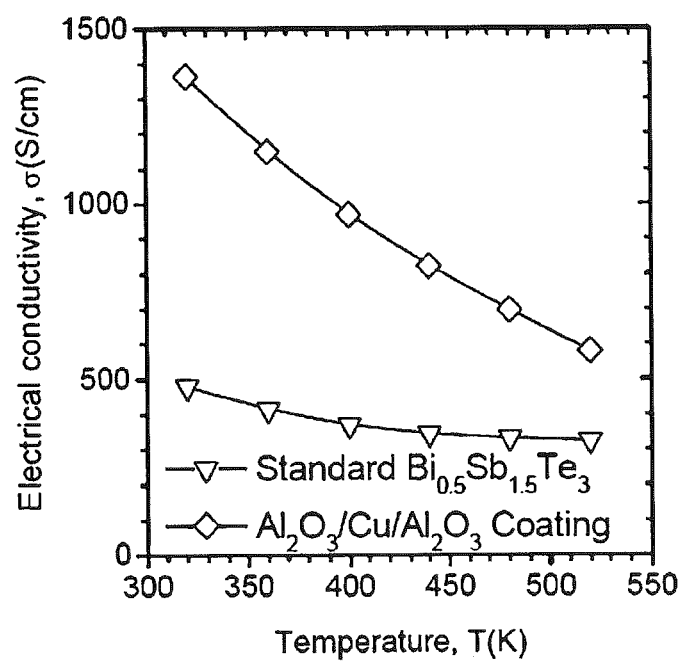
Figure 14C:
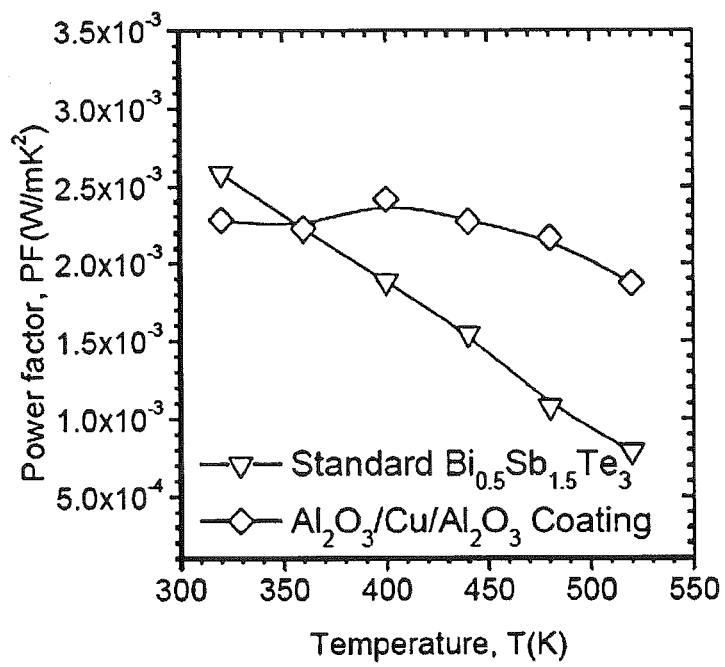
Figure 14D:
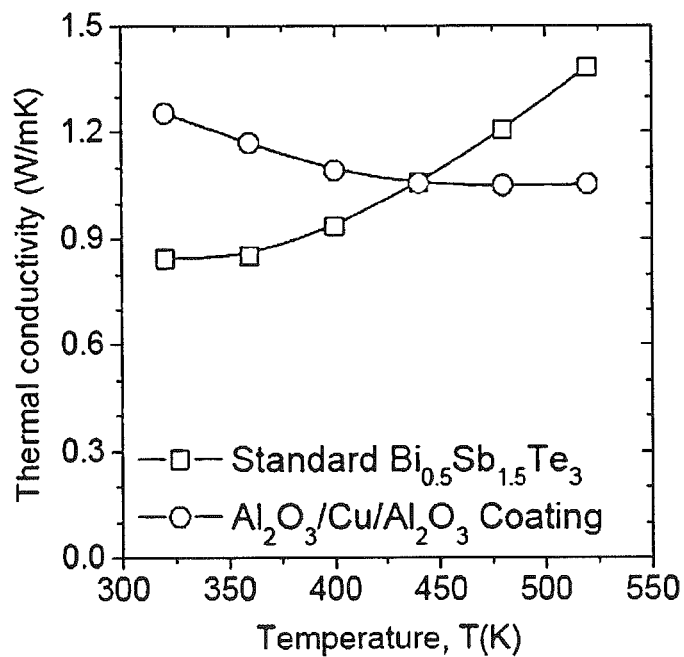
Figure 14E:
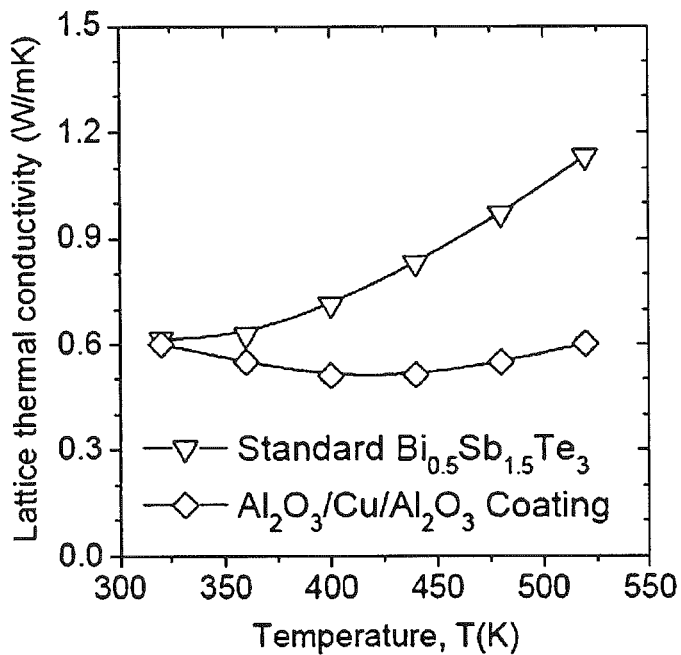
Figure 14F:
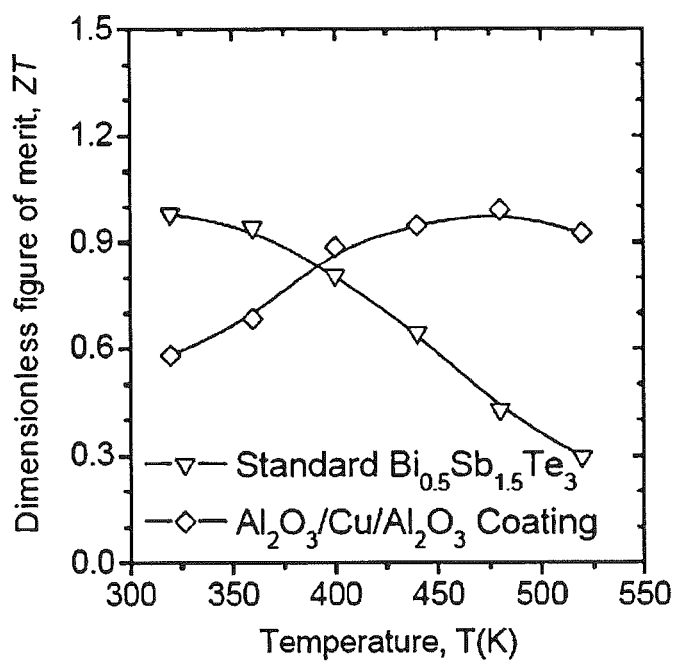
Figure 15A:
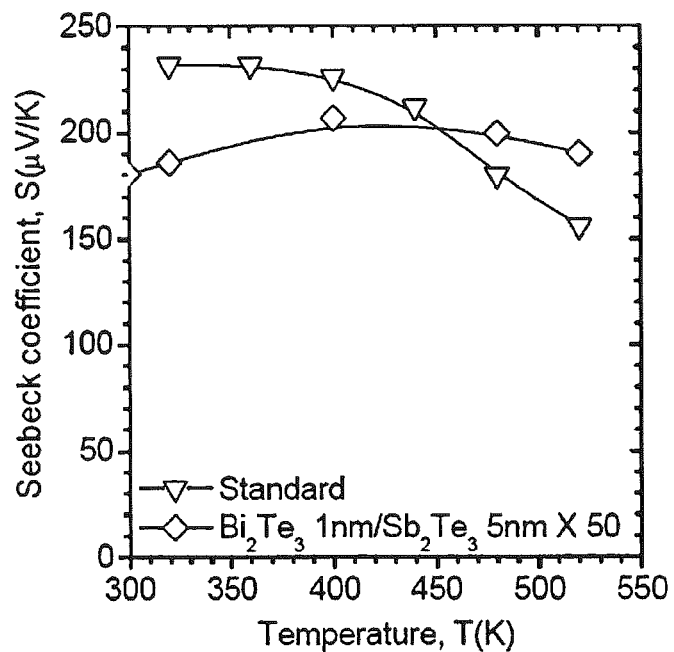
FIGS. 15A to 15F are graphs of the Seebeck coefficient, electrical conductivity, power factor, thermal conductivity, lattice thermal conductivity, and thermoelectric figure of merit ZT of a thermoelectric material prepared according to Example 6, respectively.
Figure 15B:
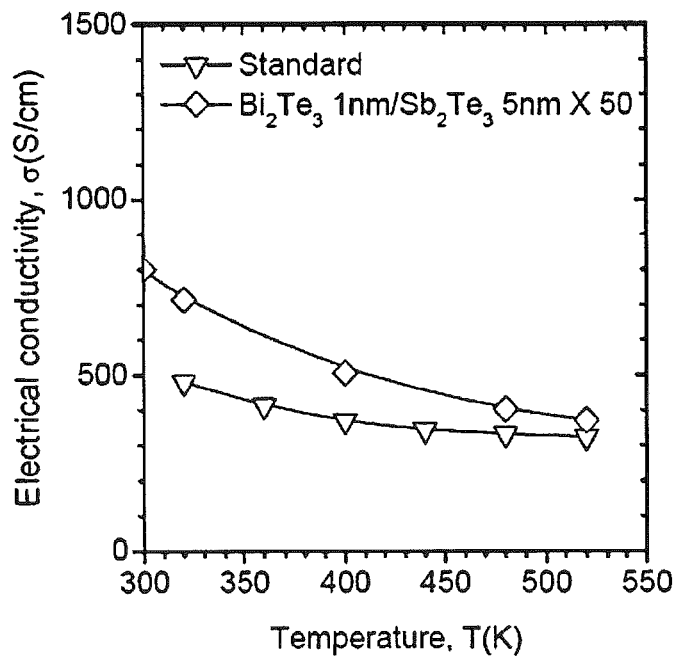
Figure 15C:
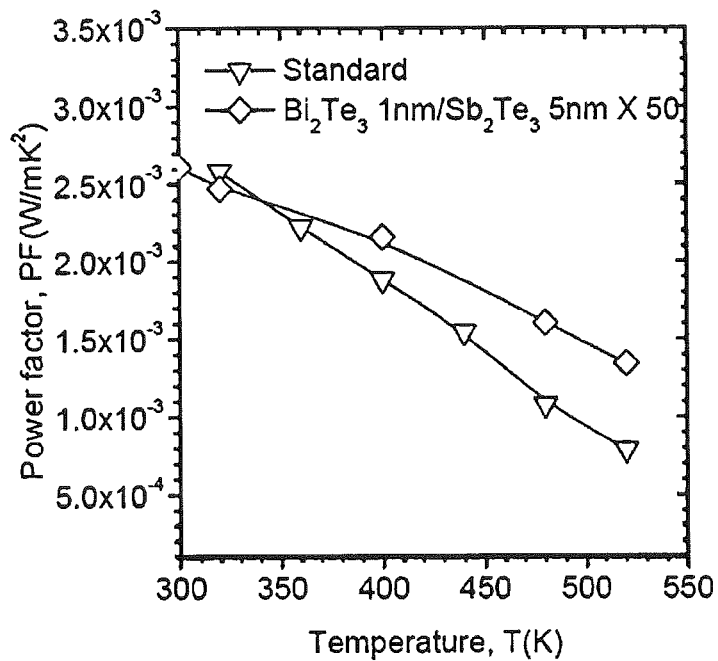
Figure 15D:
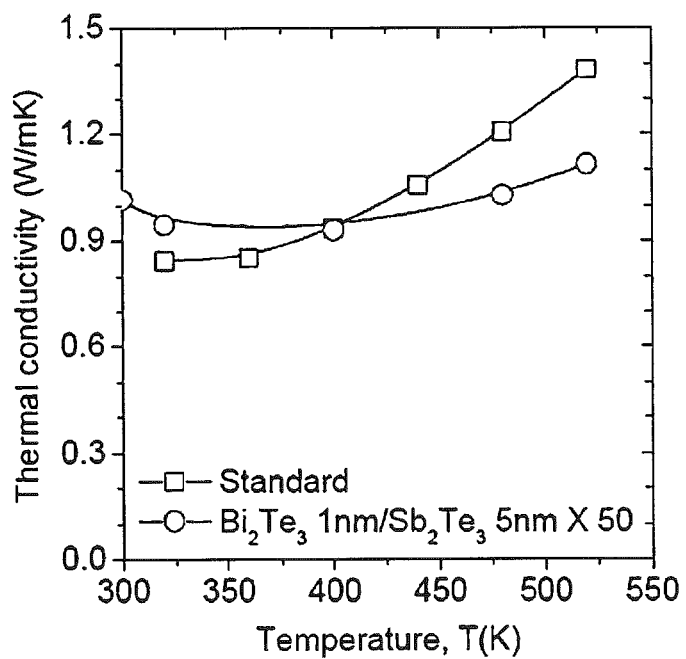
Figure 15E:
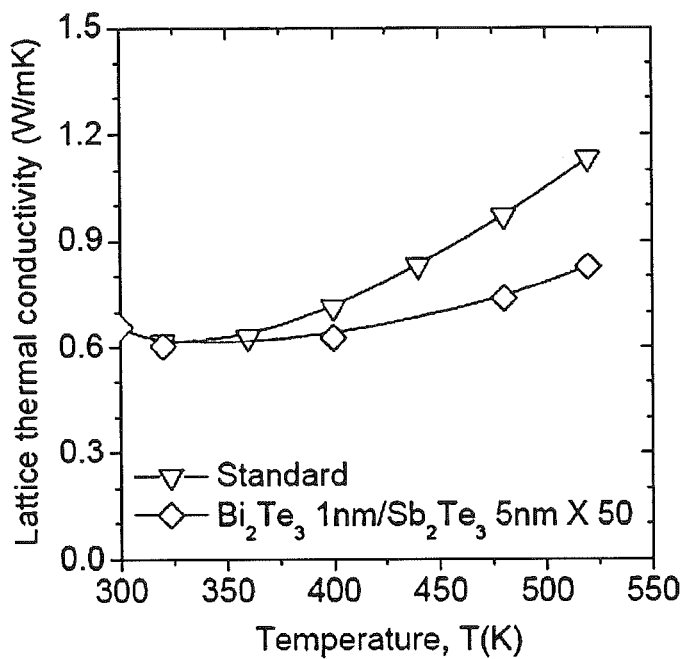
Figure 15F:
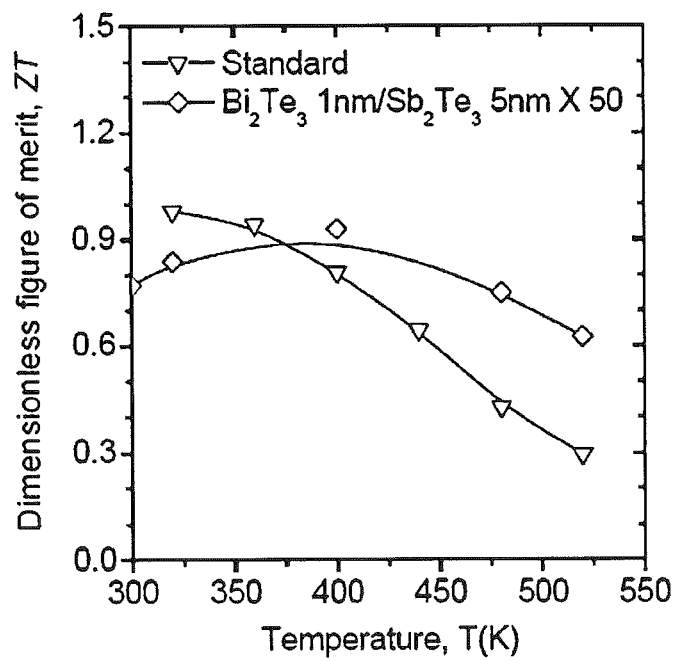
Figure 16A:
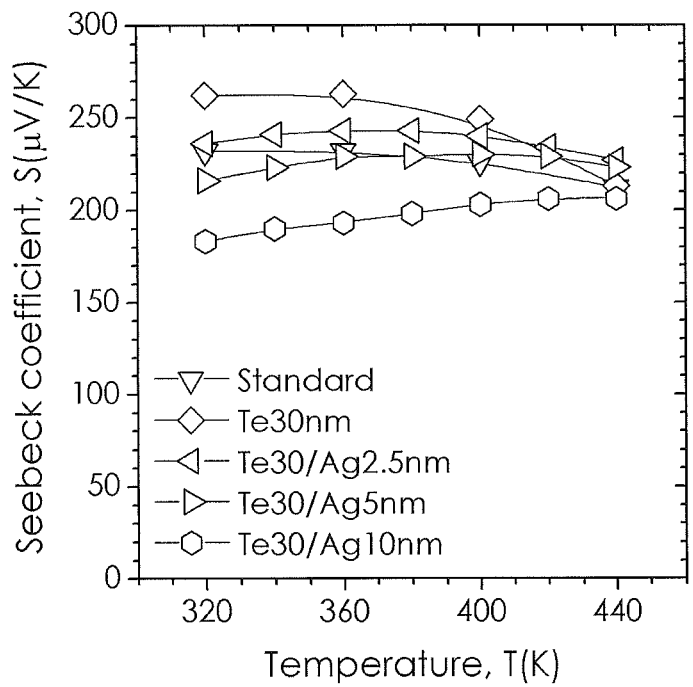
FIGS. 16A to 16F are graphs of the Seebeck coefficient, electrical conductivity, power factor, thermal conductivity, lattice thermal conductivity, and thermoelectric figure of merit ZT of a thermoelectric material prepared according to Example 7, respectively.
Figure 16B:
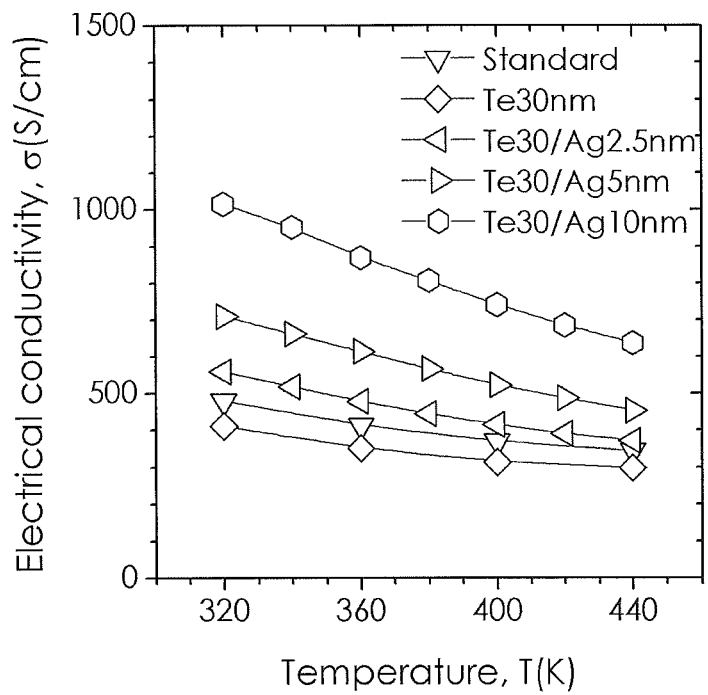
Figure 16C:
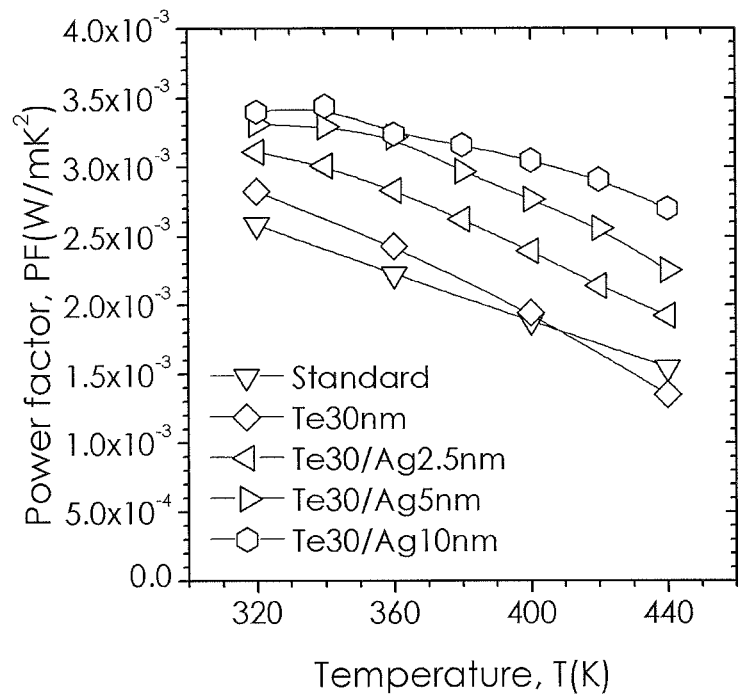
Figure 16D:
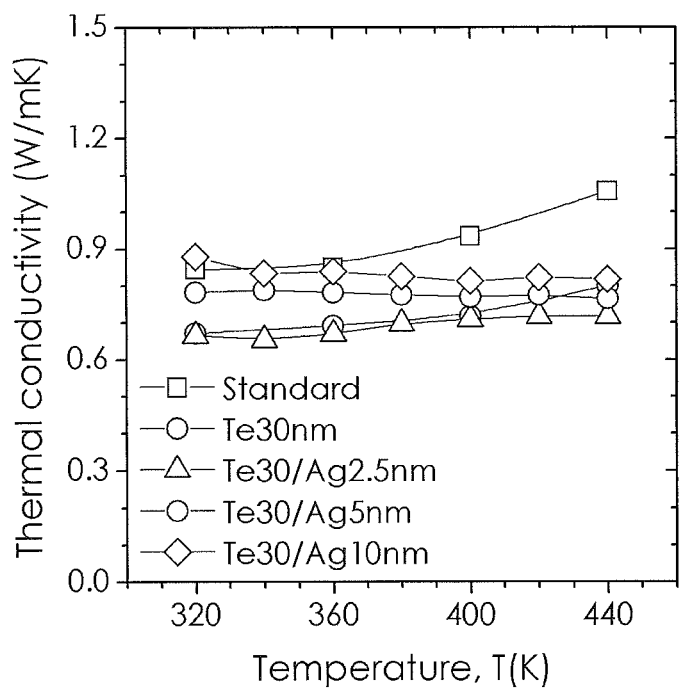
Figure 16E:
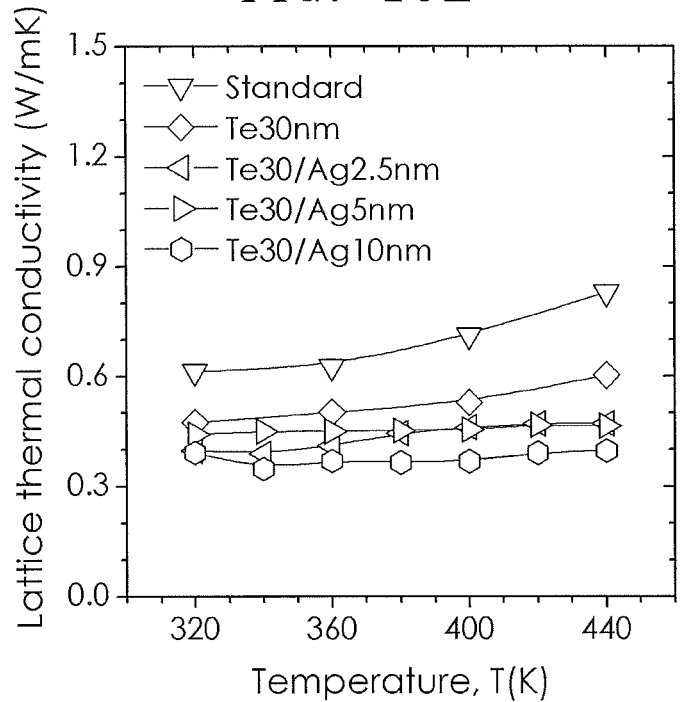
Figure 16F:
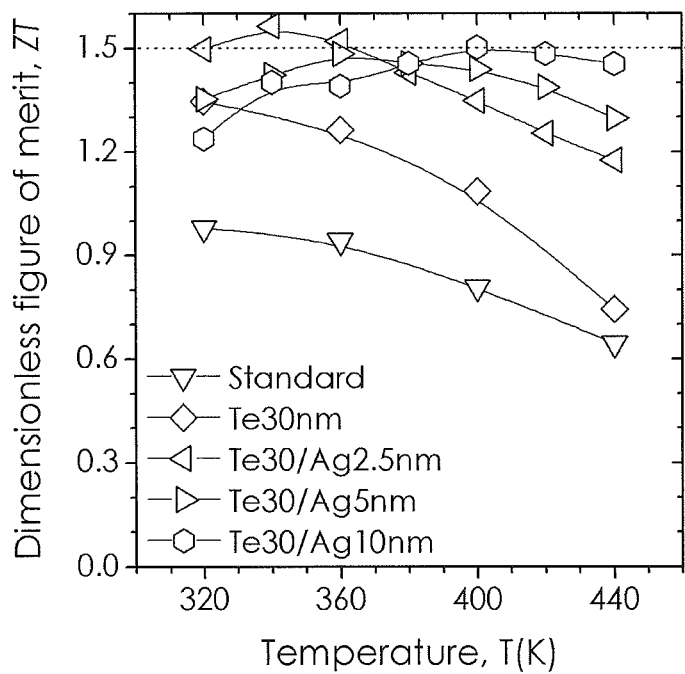

Referring to FIGS. 10A to 10F, it is confirmed that the thermoelectric figure of merit ZT for Example 1 was improved due to a decrease in thermal conductivity caused by the $Al_2O_3$ coating layer (at about 360 K or more). The thermal conductivity decrease effect was confirmed by referring to a graph of thermal conductivity (FIG. 10D), and a graph of lattice thermal conductivity (FIG. 10E). Thus, it was confirmed that an $Al_2O_3$ coating layer having a thickness of about 10 nm smaller than a phonon mean free path contributes to the embodiment of a PGEC principle. However, the $Al_2O_3$ coating layer did not result in a sufficiently high thermoelectric figure of merit ZT, and when a metal layer or a composite layer were used as in the following examples, better effects were obtained.

Example 2

About 0.5 g of the thermoelectric semiconductor powder prepared according to Preparation Example 1 was uniformly dispersed on a 4-inch silicon (Si) wafer, and a plurality of the wafers on which the thermoelectric semiconductor powder was dispersed were placed in a pulsed laser deposition device, and silver (Ag) was deposited (2400 pulses) with a 20 hertz (Hz) pulse in a 20 millitorrs (mtorr) of argon (Ar) atmosphere, at a laser power of 2 joules per square centimeter ($J/cm^2$) for 120 seconds.

After the deposition, the thermoelectric semiconductor powders coated with the Ag coating layer on the Si wafers was collected and sintered by spark plasma sintering at a temperature of 380° C., for 10 minutes, at a pressure of 70 MPa, under vacuum conditions, thereby completing manufacture of a thermoelectric material including an Ag layer having a thickness of about 5 nm as a highly-conductive metal layer.

The Seebeck coefficient, electrical conductivity, power factor, thermal conductivity, lattice thermal conductivity, and dimensionless thermoelectric figure of merit ZT of the thermoelectric material were measured in the same manner as in Example 1, and results thereof are respectively shown in FIGS. 11A, 11B, 11C, 11D, 11E, and 11F.

Referring to FIGS. 11A to 11F, due to the dispersion of the Ag coating layers, electrical conductivity was higher than that of Comparative Example 1 and the increased electrical conductivity lead to a slight increase in the Seebeck coefficient, but, eventually, the power factor was increased within the temperature measurement range. This is because the introduced highly-conductive Ag metal coating layer supplied carriers to the thermoelectric semiconductor and thus electrical conductivity of the thermoelectric material is increased. Although the Seebeck coefficient was slightly decreased due to a carrier density increase, eventually, the power factor was increased. Also, lattice contribution of thermal conductivity (thermal conductivity=electron contribution (thermal conductivity of a carrier, such as an electron or a hole)+lattice contribution (lattice thermal conductivity; thermal conductivity of phonons)) was substantially decreased, and this is because PGEC was embodied by phonon scattering due to a metal nano film having a thickness smaller than a phonon mean free path. The effect on thermoelectric efficiency was confirmed in view of an increase in the thermoelectric figure of merit ZT of the thermoelectric material including the Ag layer.

Example 3

About 0.5 g of the thermoelectric semiconductor powder prepared according to Preparation Example 1 was uniformly dispersed on a 4-inch silicon (Si) wafer, and a plurality of the wafers on which the thermoelectric semiconductor powder was dispersed were placed in a pulsed laser deposition device, and tellurium (Te) was deposited (360 pulses) thereon with an 8 Hz pulse in a 20 mtorr of argon (Ar) atmosphere, at a laser power of 2 J/cm$^2$, for 45 seconds.

After the deposition, the thermoelectric semiconductor powder coated with the Te coating layer on the Si wafers was collected and sintered by spark plasma sintering at a temperature of 380° C., for 12 minutes, at a pressure of 70 MPa, under vacuum conditions, thereby completing manufacture of a thermoelectric material including a Te layer having a thickness of about 30 nm.

The Seebeck coefficient, electrical conductivity, power factor, thermal conductivity, lattice thermal conductivity, and dimensionless thermoelectric figure of merit ZT of the thermoelectric material were measured in the same manner as in Example 1, and results thereof are respectively shown in FIGS. 12A, 12B, 12C, 12D, 12E, and 12F.

Referring to FIGS. 12A to 12F, due to the dispersion of the Te coating layer, the Seebeck coefficient was higher than that of Comparative Example 1. Due to the decrease in electrical conductivity, the power factor was not changed. However, the decreased thermal conductivity led to a higher ZT.

Example 4

About 0.5 g of the thermoelectric semiconductor powder prepared according to Preparation Example 1 was uniformly dispersed on a 4-inch silicon (Si) wafer, and a plurality of the wafers on which the thermoelectric semiconductor powder was dispersed were placed in a DC magnetron sputtering device, and tellurium (Te), copper (Cu), and tellurium (Te) were sequentially deposited thereon. Te was deposited with power of 100 W in a 5 mtorr of Ar atmosphere for 75 seconds, Cu was deposited with power of 100 W in a 5 mtorr of Ar atmosphere for 15 seconds, and then, Te was again deposited under the conditions used to deposit the Te.

After the deposition, the thermoelectric semiconductor powder coated with the Te/Cu/Te coating layer on the Si wafers was collected and sintered by spark plasma sintering at a temperature of 380° C., for 10 minutes, at a pressure of 70 MPa, under vacuum conditions, thereby completing manufacture of a thermoelectric material including a Te/Cu/Te multi-layer in which a thickness of the Te layer was 30 nm, a thickness of the Cu layer was 5 nm, and a thickness of the other Te layer was 30 nm.

The Seebeck coefficient, electrical conductivity, power factor, thermal conductivity, lattice thermal conductivity, and dimensionless thermoelectric figure of merit ZT of the thermoelectric material were measured in the same manner as in Example 1, and results thereof are respectively shown in FIGS. 13A, 13B, 13C, 13D, 13E, and 13F.

Referring to FIGS. 13A to 13F, the power factor was increased in the entire temperature measurement range, the lattice thermal conductivity was decreased, and the maximum ZT was 1.3 or more.

Example 5

About 0.5 g of the thermoelectric semiconductor powder prepared according to Preparation Example 1 was uniformly dispersed on a 4-inch silicon (Si) wafer, and a plurality of the wafers on which the thermoelectric semiconductor powder was dispersed were placed in a sputtering device, and $Al_2O_3$, Cu, and $Al_2O_3$ were sequentially deposited thereon. $Al_2O_3$ was deposited using an Al target with power of 100 W for 30 seconds in an oxygen atmosphere by DC magnetron reactive sputtering, Cu was deposited with power of 100 W for 15 seconds in a 5 mtorr of Ar atmosphere by DC magnetron sputtering, and then, $Al_2O_3$ was deposited using an Al target with power of 100 W for 30 seconds in an oxygen atmosphere by DC magnetron reactive sputtering, thereby depositing a multi-layer of $Al_2O_3$/Cu/$Al_2O_3$ on thermoelectric semiconductor powder.

After the deposition, the thermoelectric semiconductor powder coated with the $Al_2O_3$/Cu/$Al_2O_3$ composite multi-layer on the Si wafers was collected and sintered by spark plasma sintering at a temperature of 380° C., for 10 minutes, at a pressure of 70 MPa, under vacuum conditions, thereby completing manufacture of a thermoelectric material including a $Al_2O_3$/Cu/$Al_2O_3$ composite multi-layer in which a thickness of the $Al_2O_3$ layer was 10 nm, a thickness of the Cu layer was 5 nm, and a thickness of another $Al_2O_3$ layer was 10 nm.

The Seebeck coefficient, electrical conductivity, power factor, thermal conductivity, lattice thermal conductivity, and dimensionless thermoelectric figure of merit ZT of the thermoelectric material were measured in the same manner as in Example 1, and results thereof are respectively shown in FIGS. 14A, 14B, 14C, 14D, 14E, and 14F.

Referring to FIGS. 14A to 14F, the Seebeck coefficient was decreased, the electrical conductivity was increased, and ZT was increased in a high temperature range.

Example 6

About 0.5 g of the thermoelectric semiconductor powder prepared according to Preparation Example 1 was uniformly dispersed on a 4-inch silicon (Si) wafer, and a plurality of the wafers on which the thermoelectric semiconductor powder was dispersed were placed in a sputtering device, and a super-lattice was deposited using $Bi_2Te_3$ and $Sb_2Te_3$ as targets. $Bi_2Te_3$, and $Sb_2Te_3$ were deposited by pulse laser deposition, and $Bi_2Te_3$ and $Sb_2Te_3$ were alternately deposited to form a superlattice film of $Bi_2Te_3$/$Sb_2Te_3$ on the thermoelectric semiconductor powder.

After the deposition, the thermoelectric semiconductor powder coated with the $Bi_2Te_3/Sb_2Te_3$ composite multi-layer on the Si wafers was collected and sintered by spark plasma sintering at a temperature of 380° C., for 10 minutes, at a pressure of 70 MPa, under vacuum conditions, thereby completing manufacture of a thermoelectric material including a $Bi_2Te_3/Sb_2Te_3\times50$ superlattice film in which a thickness of the $Bi_2Te_3$ layer was 1 nm, and a thickness of the $Sb_2Te_3$ layer was 5 nm.

The Seebeck coefficient, electrical conductivity, power factor, thermal conductivity, lattice thermal conductivity, and dimensionless thermoelectric figure of merit ZT of the thermoelectric material were measured in the same manner as in Example 1, and results thereof are respectively shown in FIGS. 15A, 15B, 15C, 15D, 15E, and 15F.

Referring to FIGS. 15A to 15F, the Seebeck coefficient was increased in a high temperature range, the electrical conductivity was increased in the temperature measurement range and thus, power factor was increased in the entire measurement temperature range, and lattice thermal conductivity was decreased in a high temperature range. That is, ZT was increased in a high temperature range.

Example 7

About 0.5 g of the thermoelectric semiconductor powder prepared according to Preparation Example 1 was uniformly dispersed on a 4-inch silicon (Si) wafer, and a plurality of the wafers on which the thermoelectric semiconductor powder was dispersed were placed in a pulsed laser deposition device, and a Te/Ag bilayer was deposited thereon. Te was deposited, and then Ag was deposited. A deposition thickness of Te was fixed to 30 nm, and a deposition thickness of Ag was 2.5, 5, and 10 nm.

After the deposition, the thermoelectric semiconductor powder coated with the Te/Ag bi-layer on the Si wafers was collected and sintered by spark plasma sintering at a temperature of 380° C., for 10 minutes, at a pressure of 70 MPa, under vacuum conditions, thereby completing manufacture of a thermoelectric material.

The Seebeck coefficient, electrical conductivity, power factor, thermal conductivity, lattice thermal conductivity, and dimensionless thermoelectric figure of merit ZT of the thermoelectric material were measured in the same manner as in Example 1, and results thereof are respectively shown in FIGS. 16A, 16B, 16C, 16D, 16E, and 16F.

Referring to FIGS. 16A to 16F, the Seebeck coefficient was increased in a high temperature range, the electrical conductivity was increased in the temperature measurement range and thus, the power factor was increased in a whole range, and lattice thermal conductivity was decreased in a high temperature range. Also, lattice thermal conductivity was decreased. That is, ZT was improved in a temperature measurement range, and the maximum ZT was 1.5 or more.

As described above, thermoelectric materials according to the one or more of the above embodiments of the present invention are highly-efficient compared to a conventional alloy-type thermoelectric material by increasing electrical conductivity or the Seebeck coefficient to increase the power factor, or decreasing lattice thermal conductivity to increase thermoelectric efficiency. The thermoelectric material is used in various thermoelectric modules and thermoelectric devices.

It should be understood that the embodiments described herein should be considered in a descriptive sense only and not for purposes of limitation. Descriptions of features or aspects within each embodiment should typically be considered as available for other similar features or aspects in other embodiments.

What is claimed is:

1. A thermoelectric material comprising:
   a thermoelectric semiconductor powder, wherein the thermoelectric semiconductor powder comprises a Bi—Te based thermoelectric semiconductor doped with Sb; and
   a coating layer on an outer surface of each particle of the thermoelectric semiconductor powder,
   wherein the coating layer comprises at least one ceramic material selected from the group consisting of aluminum oxide, MN and BN, wherein an average thickness of the coating layer is about 1 nm to about 10 nm and the average thickness of the coating layer is equal to or smaller than a mean free path of phonons of the thermoelectric semiconductor such that phonons are scattered by the coating layer, and
   wherein a thermal conductivity of the thermoelectric material is decreased as compared to a thermoelectric material comprising the same thermoelectric semiconductor powder without a coating layer on the outer surface of each particle.

2. The thermoelectric material of claim 1, wherein the coating layer overlaps the outer surface of each particle of the thermoelectric semiconductor powder partly or fully.

3. The thermoelectric material of claim 1, wherein the average particle size of the thermoelectric semiconductor powder is from about 0.03 μm to about 100 μm.

4. The thermoelectric material of claim 1, wherein the coating layer has a single layer structure.

5. A method of preparing a thermoelectric material, the method comprising:
   preparing a thermoelectric semiconductor powder, wherein the thermoelectric semiconductor powder comprises a Bi—Te based thermoelectric semiconductor doped with Sb;
   forming a coating layer comprising at least one ceramic material selected from the group consisting of aluminum oxide, MN and BN on the thermoelectric semiconductor powder by vapor deposition, wherein an average thickness of the coating layer is about 1 nm to about 10 nm and the average thickness of the coating layer is equal to or smaller than a mean free path of phonons of the thermoelectric semiconductor; and
   sintering the thermoelectric semiconductor powder including the formed coating layer,
   wherein a thermal conductivity of the thermoelectric material is decreased as compared to a thermoelectric material comprising the same thermoelectric semiconductor powder without a coating layer on the outer surface of each particle.

6. The method of claim 5, wherein the vapor deposition comprises direct current magnetron sputtering, radio frequency sputtering, thermal/vacuum evaporation, ion plating, ion beam deposition, molecular beam epitaxy, electroplating, plasma spraying, laser ablation, E-beam ablation, metal-organic chemical vapor deposition, or hydride vapor phase epitaxy.

* * * * *